(12) United States Patent
Kenington

(10) Patent No.: US 9,397,396 B2
(45) Date of Patent: Jul. 19, 2016

(54) RADIO SYSTEM AND A METHOD FOR RELAYING PACKETIZED RADIO SIGNALS

(75) Inventor: Peter Kenington, Chepstow (GB)

(73) Assignee: KATHREIN-WERKE KG, Rosenheim (DE)

( * ) Notice: Subject to any disclaimer, the term of this patent is extended or adjusted under 35 U.S.C. 154(b) by 370 days.

(21) Appl. No.: 12/416,626

(22) Filed: Apr. 1, 2009

(65) Prior Publication Data
US 2010/0254299 A1 Oct. 7, 2010

(51) Int. Cl.
| H01Q 3/26 | (2006.01) |
| H03F 1/32 | (2006.01) |
| H04B 7/06 | (2006.01) |
| H04B 17/21 | (2015.01) |

(52) U.S. Cl.
CPC .............. *H01Q 3/267* (2013.01); *H03F 1/3247* (2013.01); *H03F 1/3282* (2013.01); *H04B 7/063* (2013.01); *H04B 17/21* (2015.01)

(58) Field of Classification Search
None
See application file for complete search history.

(56) References Cited

U.S. PATENT DOCUMENTS

| 4,415,418 | A | 11/1983 | Turre et al. |
| 5,852,630 | A | 12/1998 | Langberg et al. |
| 5,989,402 | A | 11/1999 | Chow et al. |
| 6,157,343 | A | 12/2000 | Andersson et al. |
| 6,292,135 | B1 | 9/2001 | Takatori et al. |
| 6,510,191 | B2 * | 1/2003 | Bockelman ............. G06F 1/022 327/269 |
| 6,823,001 | B1 | 11/2004 | Chea |
| 6,944,188 | B2 | 9/2005 | Sinha et al. |
| 7,194,021 | B2 * | 3/2007 | Darbel ............... H03H 17/0254 375/143 |
| 7,483,450 | B1 | 1/2009 | Giese et al. |

(Continued)

FOREIGN PATENT DOCUMENTS

| CH | EP 1672783 A1 * | 6/2006 | ............ H03F 1/0222 |
| DE | 202005009960 | 9/2005 | |

(Continued)

OTHER PUBLICATIONS

International Search Report & Written Opinion issued in International Patent Application No. PCT/EP2010/053713 dated Jul. 1, 2010.

(Continued)

*Primary Examiner* — Marsha D. Banks Harold
*Assistant Examiner* — Christopher Wyllie
(74) *Attorney, Agent, or Firm* — Stephen H. Eland; Dann, Dorfman, Herrell & Skillman

(57) ABSTRACT

The present invention provides a radio system and a method for relaying packetized radio signals. The radio system comprises at least one transmit path, a base band calibration signal generator for generating a base band calibration signal, a digital predistortion unit, a calibration unit and a feedback path. The feedback path is commonly used by the digital predistortion unit and the calibration unit for feeding back a feedback signal. The feedback signal is adapted to update at least one of phase and amplitude changes and the digital predistortion. The present invention further relates to a method for relaying packetized radio signals. The method is capable of updating the digital predistortion as well as adapted for an updating of the phase and amplitude changes. The updating of the digital predistortion and the updating of the phase and amplitude changes is implemented using the feedback signal. The present invention further relates to a computer program product for the manufacture of the radio system. The present invention further relates to a computer program product for the execution of the method.

26 Claims, 13 Drawing Sheets

(56) References Cited

U.S. PATENT DOCUMENTS

| | | | |
|---|---|---|---|
| 7,558,348 B1 | 7/2009 | Liu et al. | |
| 7,580,686 B2 * | 8/2009 | Fonden | H03F 1/3247 375/296 |
| 7,877,060 B1 * | 1/2011 | Khlat | H03F 1/3247 332/103 |
| 8,243,851 B2 * | 8/2012 | Kenington | H03F 1/3247 375/260 |
| 2002/0097085 A1 * | 7/2002 | Stapleton | H03F 3/2171 330/10 |
| 2002/0110211 A1 * | 8/2002 | Bockelman | G06F 1/022 375/371 |
| 2003/0095794 A1 * | 5/2003 | Chung | G11B 19/022 386/230 |
| 2003/0164961 A1 * | 9/2003 | Daly | G06T 5/001 358/1.9 |
| 2003/0236107 A1 | 12/2003 | Azuma | |
| 2004/0105509 A1 * | 6/2004 | McGowan | H03F 1/3241 375/296 |
| 2004/0151506 A1 | 8/2004 | Shiramizu et al. | |
| 2004/0204098 A1 * | 10/2004 | Owen | H04B 7/0602 455/561 |
| 2004/0246048 A1 * | 12/2004 | Leyonhjelm | H03F 1/3247 330/2 |
| 2005/0047495 A1 | 3/2005 | Yoshioka | |
| 2005/0110565 A1 | 5/2005 | Robinson | |
| 2005/0111575 A1 * | 5/2005 | Taler | H03F 1/32 375/297 |
| 2005/0282506 A1 * | 12/2005 | Azuma | H04B 7/0615 455/115.1 |
| 2006/0105715 A1 | 5/2006 | Kodani et al. | |
| 2006/0133535 A1 | 6/2006 | Jung et al. | |
| 2006/0209984 A1 * | 9/2006 | Kenington | H03F 1/0222 375/297 |
| 2006/0286940 A1 | 12/2006 | Izumi et al. | |
| 2007/0051628 A1 | 3/2007 | Dolnik | |
| 2008/0095266 A1 | 4/2008 | Rashev et al. | |
| 2008/0143562 A1 | 6/2008 | Huang et al. | |
| 2008/0219331 A1 * | 9/2008 | Liang | H04B 1/0475 375/219 |
| 2008/0232492 A1 | 9/2008 | Xiao et al. | |
| 2008/0309405 A1 | 12/2008 | Young et al. | |
| 2009/0034651 A1 | 2/2009 | Lan et al. | |
| 2010/0087227 A1 | 4/2010 | Francos et al. | |
| 2010/0093282 A1 * | 4/2010 | Martikkala | H04B 17/364 455/63.4 |
| 2010/0166109 A1 * | 7/2010 | Neumann | H03F 1/3247 375/296 |
| 2010/0166110 A1 * | 7/2010 | Neumann | H04L 27/368 375/296 |
| 2010/0254299 A1 * | 10/2010 | Kenington | H01Q 3/267 370/315 |
| 2010/0254441 A1 * | 10/2010 | Kenington | H03F 1/3247 375/214 |
| 2010/0255774 A1 * | 10/2010 | Kenington | H04B 17/10 455/9 |
| 2010/0255775 A1 * | 10/2010 | Kenington | H04B 17/10 455/9 |
| 2011/0051847 A1 | 3/2011 | Flury et al. | |
| 2011/0065408 A1 * | 3/2011 | Kenington | H04B 1/1036 455/303 |
| 2011/0065409 A1 * | 3/2011 | Kenington | H04B 1/126 455/307 |
| 2012/0020392 A1 | 1/2012 | O'Keeffe et al. | |
| 2012/0027066 A1 | 2/2012 | O'Keeffe | |

FOREIGN PATENT DOCUMENTS

| | | | |
|---|---|---|---|
| EP | 0295942 | | 12/1988 |
| EP | 1389837 | | 2/2004 |
| EP | 1486778 | | 12/2004 |
| EP | 1543935 | | 6/2005 |
| EP | 1608082 | | 12/2005 |
| EP | 1120858 | | 4/2007 |
| EP | 2204903 | | 7/2010 |
| EP | 2204903 A1 * | 7/2010 | ............ H03F 1/3247 |
| EP | 1649614 | | 11/2010 |
| JP | EP 1389837 A1 * | 2/2004 | ............... H01Q 3/26 |
| JP | 2005331411 | | 12/2005 |
| WO | WO 9615585 | * | 5/1996 |
| WO | 96/33405 | | 10/1996 |
| WO | 03/019773 | | 3/2003 |
| WO | 2010/053713 | | 4/2010 |
| WO | 2010/092076 | | 8/2010 |
| WO | 2010/092082 | | 8/2010 |

OTHER PUBLICATIONS

International Search Report & Written Opinion issued in International Patent Application No. PCT/EP2010/053694 dated Nov. 11, 2010.

International Search Report & Written Opinion issued in International Patent Application No. PCT/EP2010/053703 dated Nov. 11, 2010.

International Search Report & Written Opinion issued in International Patent Application No. PCT/EP2010/053707 dated Jun. 14, 2010.

Patient Test Procedure Brochure, www.ReliaLAB.com, printed Jun. 2005, 7 pages.

Vrouwe et al, Direct Measurement of Lithium in Whole Blood Using Microchip Capillary Electrophoresis With Integrated Conductivity Detection (XP-002447049), Electrophoresis, 2004, 25, pp. 1660-1667.

Vrouwe et al, Microchip Analysis of Lithum in Blood Using Movin Boundary Electrophoresis and Zone Electrophoresis (XP-002447050), Electrophoresis, 2005, 26, pp. 3032-3042.

Invitation to Pay Additional Fees (Form PCT/ISA/206) issued in PCT/EP2007/004468 on Nov. 27, 2007, 12 pages.

International Search Report dated Jul. 1, 2010 issued in International Patent Application No. PCT/EP2010/053713.

International Preliminary Report on Patentability issued in PCT/EP10/53713 on Oct. 4, 2011.

Examination Report issued in EP Application No. 10711373.0 on May 13, 2013.

Examination Report issued in EP Application No. 10710578.5 on May 13, 2013.

\* cited by examiner

RADIO SYSTEM AND A METHOD FOR RELAYING PACKETIZED RADIO SIGNALS

CROSS REFERENCE TO OTHER APPLICATIONS

The present application is related to "Radio system and method for relaying radio signals with a power calibration of transmit radio signals" U.S. application Ser. No. 12/416,630, now issued as U.S. Pat. No. 8,140,007, filed concurrently on Apr. 1, 2009 and to "A Radio System And A Method For Relaying Radio Signals" U.S. application Ser. No. 12/416,639, now issued as U.S. Pat. No. 8,396,416, filed concurrently on Apr. 1, 2009 and to "A Radio System And A Method For Relaying Radio Signals" U.S. application Ser. No. 12/416,596, now issued as U.S. Pat. No. 8,243,851, filed concurrently on Apr. 1, 2009. The entire disclosure of each of the foregoing applications is incorporated herein by reference.

FIELD OF THE INVENTION

The field of the present invention relates to a radio system for relaying packetized radio signals. The field of the present invention further relates to a method for relaying packetized radio signals. Furthermore, the field of the present invention relates to a computer program product enabling a foundry to carry out the manufacture of the radio system for relaying packetized radio signals and a computer program product enabling a processor to carry out the method for relaying packetized radio signals.

BACKGROUND OF THE INVENTION

A use of mobile communications networks has tremendously increased over the last decade. Operators of mobile communications networks have increased a number of base stations in order to meet an increased request for service by users of the mobile communications network. The base stations typically comprise radio systems for relaying radio signals. The radio signals are typically relayed into a cell of the mobile communications network. It is of interest for the operator of the mobile communications network to reduce the running costs of the base stations. It is one option to implement the radio system as an antenna embedded radio system. With the antenna embedded radio system some of the hardware components of the radio system may be implemented on a chip. The antenna embedded radio system therefore reduces the costs of the base station. Implementing the radio system as the antenna embedded radio system reduces space needed to house the hardware components of the base station. Power consumption during normal operation of the radio system is substantially reduced when implementing the antenna embedded radio system comprising the chip.

It is of interest to provide a reliable quality of service to an individual user of the mobile communications network given the increase in the number of users. Several techniques have been suggested in order to deal with the increased number of users within the mobile communications network. One of the several techniques comprises beam forming capabilities in order to direct a beam relayed by the radio system in different directions to improve service coverage within the cells of the mobile communications network. The beam forming techniques rely on defined phase and amplitude relations between several of the antenna elements of the active antenna system. Calibration of transmit paths and receive paths is required to provide the defined phase and amplitude relationship between the beams. The calibration allows the estimation of a phase and amplitude deviation accumulated along the transmit path of the radio system. Likewise the calibration comprises estimating phase and amplitude deviations accumulated along the receive paths of the radio system. The calibration may further comprise a determination of transit times needed for a message signal to travel from the digital radio interface to the antenna element in order to be relayed. In a second step the phase and amplitude deviation accumulated along the transmit paths can be corrected. An appropriate phase and amplitude change may be applied to the individual transmit paths to yield the defined phase and amplitude relationship between the individual transmit paths of the radio system, in order to allow for beam forming techniques.

In a modern mobile communications network a payload signal is provided as a packetized payload signal to the radio system. Different to a continuous payload signal the packetized payload signals have a defined temporal order when the packetized payload signal is provided to a digital radio interface. Within the radio system some processing may be applied to the packetized payload signal. The processing may comprise the packetized payload signal passing several buffers and phase locked loops (PLLs). With the data processing the defined temporal order of the packetized payload signal may be deteriorated or even destroyed. In the prior art it was common practise to calibrate transmit paths along which the packetized payload signal travels when being relayed by the radio station. The relaying by the radio station comprises the data processing. The present invention provides a calibration of the transmit paths and a calibration of the digital predistortions when relaying packetized radio signals. Therefore the present invention is adapted to ascertain the temporal order of the packetized payload signal even with several steps of digital data processing applied to the a packetized payload signal. The present invention discloses the calibration of the phase and amplitude changes and the updating of the digital predistortion in the context of packetized internal radio signals of the system. It is to be understood that a co-pending application of the applicant discloses the calibration of phase and amplitude changes and the updating of the digital predistortion in the case of a non-packetized internal radio signals (U.S. application Ser. No. 12/416,596, now issued as U.S. Pat. No. 8,243,851) which is incorporated herein by reference.

Applying the phase and amplitude changes to the transmit paths of the radio system strongly relies on transfer characteristics of the radio system being linear. Typically, an amplifier used within the transmit paths causes non-linearities within the transfer characteristics of the transmit paths. Analogue predistortion or digital predistortion are known methods for correcting the non-linearities of the transmit paths. It is of interest to provide the digital predistortion prior to the applying of the phase and amplitude changes. With significant non-linearities in the transfer characteristics of the transfer paths, the phase and amplitude changes will not yield the defined relative phase and amplitude relationship needed for the beam forming techniques.

The calibration of the phase and amplitude changes and the digital predistortion require a feedback path. The feedback path is in both cases used in order to evaluate any changes a radio signal undergoes when being relayed along the transmit paths. This holds for both a calibration signal as well as the payload signal being relayed by the radio system.

The prior art discloses two distinct feedback paths for calibrating the phase and amplitude changes and the digital predistortion. This requires time and it would be advantageous to calibrate the radio system faster and more efficiently. The two feedback paths are expensive to implement.

SUMMARY OF THE INVENTION

A radio system for relaying packetized radio signals according to the present invention comprises: at least one transmit path, a base band calibration signal generator, a digital predistortion unit, a calibration unit and a feedback path. The at least one transmit path is adapted to forward a packetized payload signal as a transmit signal. The base band calibration signal generator is adapted for inserting a base band calibration signal into the packetized payload signal. The base band calibration signal is synchronised to a synchronisation unit. The digital predistortion unit is adapted to apply a digital predistortion to the payload signal for linearising a transfer characteristic of the radio system. The calibration unit is adapted to apply phase and amplitude changes to the at least one transmit path. The feedback path is provided for feeding back a feedback signal. The feedback path is commonly used by the digital predistortion unit and the calibration unit. The feedback signal is adapted to update at least one of the phase and amplitude changes and the digital predistortion.

At least one of the phase and amplitude changes and the digital predistortions is adaptable using correlations of at least two of the packetized payload signal, the base band calibration signal and the feedback signal. It is to be understood that the using of correlations, i.e. the use of correlating methods comprises correlating signals in substantially identical frequency ranges. It is convenient to carry out the correlation in the base band of the radio system. Without any limitation it is possible to carry out the correlations at an intermediate frequency. The intermediate frequency may be any frequency between the base band of the radio system and a band of transmission of the radio system.

It is to be understood that the base band calibration signal provided with the present invention can be used concurrently to update the phase and amplitude changes and the digital predistortion. As will be appreciated by a person skilled in the art it is not necessary to provide the base band calibration signal for updating the digital predistortion.

The radio system as described herein enables a reduction in costs of manufacturing the chip as the radio system comprises one of the feedback paths. The speed of the calibration of the digital predistortions and the phase and amplitude changes is increased.

The term "relaying" as used herein should be construed as comprising a transmitting as well as a receiving of radio signals. The receiving of the radio signals is commonly referred to as Rx. The transmitting of the radio signals is commonly referred to as Tx.

According to a further aspect the present invention relates to a method for relaying packetized radio signals. The method comprises providing a packetized payload signal, generating a base band calibration signal and applying a digital predistortion to the packetized payload signal. The base band calibration signal is adapted to be inserted into the packetized payload signal. The base band calibration signal is synchronised to a synchronisation unit. The method further comprises applying phase and amplitude changes to at least one of the transmit paths. The method further comprises forwarding the payload signal as a transmit signal along at least one transmit path. According to the method a feedback signal is fed back into a feedback path. The method further comprises updating the digital predistortion in response to the feedback signal. Furthermore the method comprises updating the phase and amplitude changes in response to the feedback signal.

The present invention further provides a computer program product for a manufacture of the radio system according to the invention.

In yet another aspect the present invention provides a computer program product for carrying out the method according to the invention.

DETAILED DESCRIPTION OF THE INVENTION

The invention will now be described on the basis of the drawings. It will be understood that the embodiments and aspects of the invention described herein are only examples and do not limit the protective scope of the claims in any way. The invention is defined by the claims and their equivalents. It will also be understood that features of one aspect can be combined with a feature of a different aspect.

Figure 1:
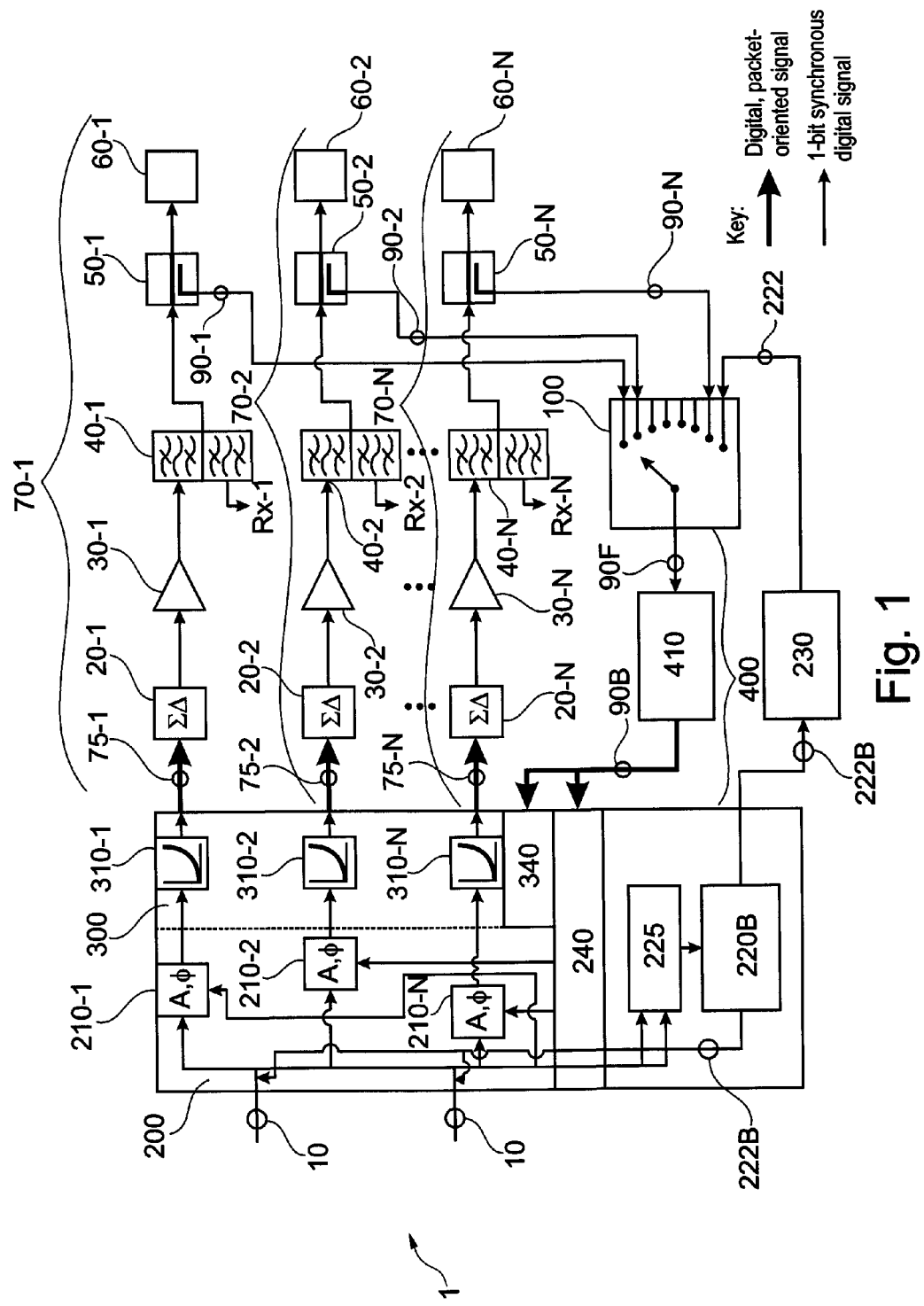
FIG. 1 shows a radio system.

FIG. 1 shows a radio system 1. A packetized payload signal 10 is forwarded to the radio system 1. Typically the packetized payload signal 10 is provided in a format comprising an in phase component I and a quadrature phase component Q. The packetized payload signal 10 is forwarded to a digital radio interface (DRI) as is known in the art. The digital radio interface may be implemented in one non-limiting aspect of the invention according to the open base station architecture initiative standard (OBSAI). The packetized payload signal 10 is typically provided in a base band frequency range. The packetized payload signal 10 may also be referred to as the payload signal 10 in short. A calibration unit 200 is adapted to apply amplitude and phase changes 210-1, 210-2, ..., 210-N to the packetized payload signal 10. A digital predistortion unit 300 is provided in the radio system 1. The digital predistortion unit 300 is adapted to apply a digital predistortion 310-1, 310-2, ..., 310-N to the packetized payload signal 10. The digital predistortion 310-1, 310-2, ..., 310-N may also be referred to as DPD in short. The radio system 1 comprises at least one transmit paths 70-1, 70-2, ..., 70-N. Only three of the transmit paths 70-1, 70-2, ..., 70-N are shown. Obviously any other number of transmit paths 70-1, 70-2, ..., 70-N is conceivable. Typically, the transmit paths 70-1, 70-2, ..., 70-N are terminated by an antenna element 60-1, 60-2, ..., 60-N. The transmit paths 70-1, 70-2, ..., 70-N are adapted to relay the packetized payload signal 10 as a transmit signal 75-1, 75-2, ..., 75-N along the transmit paths 70-1, 70-2, ..., 70-N. The antenna elements 60-1, 60-2, ..., 60-N may be transmit-only antenna elements. Alternatively or additionally, the antenna elements 60-1, 60-2, ..., 60-N may be transmit and receive antenna elements. Only the transmit paths 70-1, 70-2, ..., 70-N are shown in this aspect of the invention. The radio system 1 is adapted to be combined with a receive system known in the art. The receive system is not shown but will comprise receive paths Rx-1, Rx-2, ..., Rx-N.

The transmit signals 75-1, 75-2, ..., 75-N are digital to analogue converted using a digital to analogue converter 20-1, 20-2, ..., 20-N along the transmit paths 70-1, 70-2, ..., 70-N. The digital to analogue converter 20-1, 20-2, ..., 20-N may comprise a sigma delta digital to analogue converter, as shown in FIG. 1. The sigma delta digital to analogue converters 20-1, 20-2, ..., 20-N do not require an up-converter (not shown) for up-converting and filtering the transmit signal 75-1, 75-2, ..., 75-N. An amplifier 30-1, 30-2, ..., 30-N is provided for amplifying the transmit signal 75-1, 75-2, ..., 75-N. A filter 40-1, 40-2, ..., 40-N is provided for separating the transmit paths 70-1, 70-2, ..., 70-N from the receive paths Rx-1, Rx-2, ..., Rx-N. The filter 40-1, 40-2, ..., 40-N may be implemented as a duplex filter as shown in FIGS. 1-6. The filters 40-1, 40-2, ..., 40-N are adapted to eliminate any signal components that are out of a frequency band of transmission of the radio system 1.

In order to allow for a calibration of the radio system 1, a portion of the transmit signals 75-1, 75-2, ..., 75-N is fed back to the calibration unit 200. The present invention provides a coupler 50-1, 50-2, ..., 50-N to extract a portion of the transmit signal 75-1, 75-2 ..., 75-N as a coupled transmit signal 90-1, 90-2, ..., 90-N. The feedback of the coupled transmit signals 90-1, 90-2, ..., 90-N as a feedback signal 90F allows the determination of phase and amplitude deviations accumulated between individual transmit signals 75-1, 75-2, ..., 75-N travelling along the transmit paths 70-1, 70-2, ..., 70-N. The feedback of the feedback signal 90F also enables an updating of the digital predistortion 310-1, 310-2, ..., 310-N applied to the packetized payload signal 10.

In the prior art two different feedback paths have been used for the feedback of the feedback signal 90F; a first feedback path for feedback to the calibration unit 200 and a second feedback path for feedback to the digital predistortion unit 300. The present invention provides a feedback path 400 that can be used for both a calibration of the amplitude and phase changes 210-1, 210-2, ..., 210-N as well as for an updating of the digital predistortions 310-1, 310-2, ..., 310-N. A calibration update unit 240 uses the feedback path 400, more precisely feedback signals 90F relayed along the feedback path 400, in order to update the phase and amplitude changes 210-1, 210-2, ..., 210-N applied to the packetized payload signal 10. A digital predistortion update module 340 uses the feedback path 400, more precisely the feedback signals 90F relayed along the feedback path 400, in order to update the digital predistortions 310-1, 310-2, ..., 310-N that are to be applied to the packetized payload signal 10.

The coupler 50-1, 50-2, ..., 50-N is adapted to extract the coupled transmit signal 90-1, 90-2, ..., 90-N from the transmit path 70-1, 70-2, ..., 70-N. A switch 100 is adapted to forward a selected one of the coupled transmit signals 90-1, 90-2, ..., 90-N as the feedback signal 90F into the feedback path 400.

The feedback path 400 comprises a feedback signal demodulator 410. The feedback signal demodulator 410 receives the feedback signal 90F from the switch 100. The feedback signal demodulator 410 may be adapted to attenuate the feedback signal 90F if necessary. The feedback signal demodulator 410 is further adapted to analogue to digital convert the feedback signal 90F. It is to be understood that the feedback signal 90F comprises an analogue radio frequency signal. The feedback signal demodulator 410 may comprise a sigma delta converter for the analogue to digital converting. The feedback signal demodulator 410 could, instead, comprise a conventional analogue to digital converter; a down converter (not shown) is also needed, as is known in the art. The down converter (not shown) may comprise a filtering functionality. The feedback signal demodulator 410 generates a base band feedback signal 90B. It is to be understood that the base band feedback signal 90B comprises a digital, packetized signal. The base band feedback signal 90B is forwarded to the digital predistortion update module 340 and the calibration update module 240. It will be appreciated by a person skilled in the art that modulating the feedback signal 90F to the base band frequency yielding the base band feedback signal 90B is a matter of convenience only. One may alternatively modulate the feedback signal 90F to any intermediate frequency IF between the base band frequency and the frequency band of transmission of the radio station 1.

The base band calibration signal generator 220B provides a base band calibration signal 222B that is applied to the packetized payload signal 10. The packetized payload signal 10 as forwarded to the radio system 1 at the digital radio interface DRI comprises the well defined temporal order of the packetized payload signal 10. A synchronisation unit 225 extracts the well defined temporal order of the packetized payload signal 10 thereby obtaining a clocking signal from the packetized payload signal 10. The clocking signal may, for example, be derived, from rising edges of a train of data packages in the packetized payload signal 10. The base band calibration signal generator 220B is synchronised by the clocking signal provided by the synchronisation module 225. Therefore the base band calibration signal 222B is synchronised to the packetized payload signal 10 arriving at the digital radio interface DRI of the radio station 1. The base band calibration signal 222B is forwarded to a calibration signal modulator 230. The calibration signal modulator 230 is adapted to transform the base band calibration signal 222B into a calibration signal 222 within the frequency range of the transmission of the radio system 1. The calibration signal 222 is forwarded to an entry of the switch 100.

It will be appreciated that the base band calibration signal 222B is only required for the calibration of the phase and amplitude changes 210-1, 210-2, ..., 210-N in the case of packetized payload signal 10. The updating of the digital predistortions 310-1, 310-2, ..., 310-N does instead not require provision of the base band calibration signal 222B; this holds for both cases of the packetized payload signal 10 and the non-packetized payload signal.

It is to be noted that the switch 100 provides N+1 inputs and a single output. It is possible to use the base band calibration signal 222B and/or the calibration signal 222 for calibrating the feedback path 400 with the radio system 1 as shown in FIG. 1. The switch 100 should be switched to the entry connected to the calibration signal 222 in order for the calibration update module 240 to produce a calibration of feedback deviations accumulated along the feedback path 400. More precisely a calibration is possible for signals accumulating feedback deviations between the base band calibration signal generator 220B, the calibration signal modulator 230, the switch 100, the feedback signal demodulator 410 reaching either the calibration update module 420 or the predistortion update module 340 with the switch 100 switched to the entry connected to the calibration signal 222.

If a very high accuracy for a calibration of transmit deviations 90T is required, an estimate for the feedback deviations accumulated between the base band calibration signal generator 222B, the calibration signal modulator 230 reaching the switch 100 is needed. The transmit deviations 90T comprise phase and amplitude deviations accumulated along the transmit path 70-1, ..., 70-N. The transmit deviations 90T further comprise transit times needed for a packetized payload signal 10 reaching the digital radio interface until a corresponding transmit signal 75-1, ..., 75-N is relayed by the antenna elements 60-1, 60-2, ..., 60-N.

A first guess might be to assume that the feedback deviations accumulated between the base band calibration signal generator 220B and the switch 100 are about the same as the feedback deviations accumulated by signals travelling from the switch 100 to the feedback signal demodulator 410 reaching the calibration signal update module 240 or the predistortion update module 340. Alternatively, it may be possible to measure the feedback deviations accumulated by signals travelling from the base band calibration signal generator 220B to the calibration signal modulator 230 reaching the entry port of the switch 100 for the calibration signal 222. It is to be understood that measuring the feedback deviations between the base band calibration signal generator 220B, the calibration signal modulator 230 and the switch 100 is simpler than measuring all the amplitude and phase deviations accumulated from the couplers 50-1, 50-2, ..., 50-N to the switch entries of the switch 100. As an alternative it may also be possible to provide a measurement of the feedback deviations accumulated from the exit of the switch 100 passing the calibration signal demodulator 410 reaching either the calibration signal update module 240 or the digital predistortion update module 340. It may be of interest to provide the feedback deviations accumulated from the exit of the switch 100 via the feedback signal demodulator 410 reaching the calibration signal update module 240 or the digital predistortion update module 340 at the manufacture of the radio system 1.

It is possible to measure the feedback deviations accumulated between the base band calibration signal generator 220B via the calibration signal modulator 230, the switch 100, the feedback signal demodulator 410 and the calibration signal update module 240 or the digital predistortion update module 340 using one of the measurement methods as explained above. The complete feedback path 400 may be calibrated using the calibration signal 222. It is to be noted that the base band feedback signal 90B leaving the feedback signal demodulator 410 comprises a packetized signal in synchronisation with the synchronisation unit 225. In other words the base band feedback signal 90B is in synchronisation with the packetized payload signal 10 and therefore allows the calibration of the phase and amplitude changes 210-1, 210-2, 210-N. The present invention allows the calibration of the phase and amplitude changes 210-1, 210-2, 210-N and the updating of the digital predistortions 310-1, 310-2, ..., 310-N applied to the packetized payload signal 10.

As explained above, the radio station 1 provides a defined temporal relation between the packetized payload signal 10 and the packetized base band calibration signal 90B. Therefore the feedback signals 90F and the base band feedback signal 90B are in synch with the packetized payload signal 10.

The calibration signal 222 is generated by the calibration signal modulator 230 in response to the base band calibration signal 222B provided by the base band calibration signal generator 220B. It is of interest to provide the base band calibration signal 222B and hence the calibration signal 222 of vanishing mean value for calibrating the phase and amplitude changes 210-1, 210-2, ..., 210-N. It is important that any base band calibration signal 222B or pilot signal inserted in the payload signal 10 pertaining to the calibration of the phase and amplitude changes 210-1, 210-2, ..., 210-N, should not interfere with the updating of the digital predistortion 310-1, 310-2, ..., 310-N, when considering the use of the feedback path 400 for the calibration of the phase and amplitude changes 210-1, 210-2, ..., 210-N and the updating of the digital predistortion 310-1, 310-2, ..., 310-N.

A signal present in the feedback path 400 that is not present in the packetized payload signal 10 may be interpreted as a mismatch of the digital predistortions 310-1, 310-2, ..., 310-N. Therefore the updating of the digital predistortions 310-1, 310-2, ..., 310-N and the calibration of phase and amplitude changes 210-1, 210-2, ..., 310-N have been separated in prior art systems. Suppose that a portion of the base band calibration signal 222 is intended for the calibration of the phase and amplitude changes 210-1, 210-2, ..., 210-N. If the portion of the base band calibration signal 222B pertaining to the calibration of the phase and amplitude changes 210-1, 210-2, ..., 210-N was to affect the update of the digital predistortions 310-1, 310-2, ..., 310-N, a false update of the digital predistortion 310-1, 310-2, ..., 310-N would be triggered. In other words the digital predistortions 310-1, 310-2, ..., 310-N could no longer be set reliably whilst calibrating the phase and amplitude changes 210-1, 210-2, ..., 210-N.

There are several ways to provide a base band calibration signal 222B and hence the calibration signal 222. A method for generation of calibration signals has been disclosed in a co-pending U.S. patent application 61/118,391 and UK patent application 0821580.8. The teachings of these patent applications are incorporated by reference herein.

It is a first option to place the portion of the calibration signal 222 pertaining to the calibration of the phase and amplitude changes 210-1, 210-2, ..., 210-N outside of a frequency band used in connection with the digital predistortions 310-1, 310-2, ..., 310-N, so that the portion of the calibration signal 222 pertaining to the calibration of the phase and amplitude changes 210-1, 210-2, ..., 210-N does not interfere with the updating of the digital predistortions 310-1, 310-2, ..., 310-N.

Such a placement of the portion of the calibration signal 222 pertaining to the calibration of the phase and amplitude changes 210-1, 210-2, ..., 210-N is not optimal. The portion of the calibration signal 222 pertaining to the calibration of the phase and amplitude changes 210-1, 210-2, ..., 210-N will be placed far apart from the frequency band that is of interest for the calibration of the phase and amplitude changes 210-1, 210-2, ..., 210-N.

Alternatively or additionally the portion of the calibration signal 222 pertaining to the calibration of the phase and amplitude changes 210-1, 210-2, ..., 210-N may be provided in the form of a narrow band signal (or several narrow band signals) with a zero mean value i.e. a vanishing mean value. The narrow band signal may be placed between wanted carriers of the packetized payload signal 10. It is of interest to ascertain that the portion of the calibration signal 222 pertaining to the calibration of the phase and amplitude changes 210-1, 210-2, ..., 210-N comprises a zero mean value. If the portion of the calibration signal 222 pertaining to the calibration of the phase and amplitude changes 210-1, 210-2, ..., 210-N would not comprise a zero mean value, the updating of the digital predistortions 310-1, 310-2, . . . , 310-N would be deteriorated.

It is to be noted that digital predistortion units 300 commonly average over a number of samples of feedback signals when updating the digital predistortions 310-1, 310-2, . . . 310-N. Therefore, the digital predistortion unit 300 will appear blind to any portions of the calibration signal 222 comprising a zero mean value. Obviously the updating of the digital predistortions 310-1, 310-2, . . . , 310-N relies on portions of the calibration signal 222 of non-vanishing mean value. It is to be understood that for the updating of the digital predistortions 310-1, 310-2, . . . , 310-N may be achieved based on the packetized payload signal 10. For the updating of the digital predistortions the defined temporal order of the packetized payload signal 10 is not required different to the calibrating of the phase and amplitude changes 210-1, 210-2, . . . , 210-N.

A further example for the generation of the calibration signal 222 comprising a portion of zero mean value would be a broad band, low-level signal which is spread across all channels of interest. It would be even conceivable for the broad band, low-level signal to spread over the entire bandwidth of the radio system 1. The broad band, low-level signal should appear noise-like when being used as the portion of the calibration signal 222 pertaining to the calibration of the phase and amplitude changes 210-1, 210-2, . . . , 210-N. The broad-band, low-level signal could further minimize any effect on the carriers within the bandwidth of the radio system 1. Therefore, the use of the portion of the calibration signal 222 pertaining to the calibration of the phase and amplitude changes 210-1, 210-2, . . . , 210-N would not impair the performance of the radio system 1 during the operation of the radio system 1. A pseudo random binary sequence is an example of the broad-band, low-level signal used as the portion of the calibration signal 222 pertaining to the calibration of the phase and amplitude changes 210-1, 210-2, . . . , 210-N. A further example is a noise-like spread spectrum signal.

The portions of the calibration signal 222 pertaining to the calibration of the phase and amplitude changes 210-1, 210-2, . . . , 210-N may also be used and subtracted from the feedback signal 90F prior to the calibration of the digital predistortions 310-1, 310-2, . . . , 310-N. The DPD updating unit 340 or, more conveniently, the feedback signal demodulator 410 may be used for the subtraction prior to the calibration of the digital predistortions 310-1, 310-2, . . . , 310-N. It is to be noted that the feedback signal 90F has undergone a significant amount of analogue signals processing prior to the subtraction. Therefore the subtraction will not be perfect and some residual signal from the portion of the calibration signal 222 pertaining to the calibration of the phase and amplitude changes 210-1, 210-2, . . . , 210-N will remain.

A portion of the calibration signal 222 pertaining to the updating of the digital predistortions 310-1, 310-2, . . . , 310-N may be used, provided that the portion of the calibration signal 222 pertaining of the calibration of the digital predistortions 310-1, 310-2, . . . , 310-N comprises a non-zero mean value. The calibration signal 222 is inserted into the payload signal 10.

The payload signal 10 will always be relayed along the transmit paths 70-1, 70-2, . . . , 70-N. Therefore it is conceivable to use the payload signal 10 itself as the portion of the calibration signal 222 pertaining to the calibration of the digital predistortions 310-1, 310-2, . . . , 310-N. As stated before such an approach would require the payload signal 10 to be of a non-zero mean value. A drawback of using the payload signal 10 for the calibration of the digital predistortions 310-1, 310-2, . . . , 310-N may be the fact that the payload signal 10 does not reliably cover the whole of the frequency band of interest for the digital predistortion 310-1, 310-2, . . . , 310-N.

FIG. 1 shows the switch 100 for selecting a selected one of the coupled transmit signals 90-1, 90-2, . . . , 90-N and the calibration signal 222 to be forwarded to the feedback signal modulator 410 as the feedback signal 90F. It will be appreciated by a person skilled in the art that the switch 100 may be replaced by a combiner 110 (see FIGS. 2-4). Using the combiner 110 may entail incorporating suppressors 80-1, . . . , 80-N in order to suppress at least one selected one of the coupled transmit signals 90-1, 90-2, . . . , 90-N. The suppressors 80-1, 80-2, . . . , 80-N may be implemented as a PIN diode, a variable attenuator or any other RF switch.

A position of the switch 100 is controlled by the calibration unit 200 and the digital predistortion unit 300. In other words the calibration unit 200 and the digital predistortion unit 300 know which one of the coupled transmit signals 90-1, 90-2, . . . , 90-N and the calibration signal 222, is forwarded to the feedback signal demodulator 410 as the feedback signal 90F.

Figure 2:
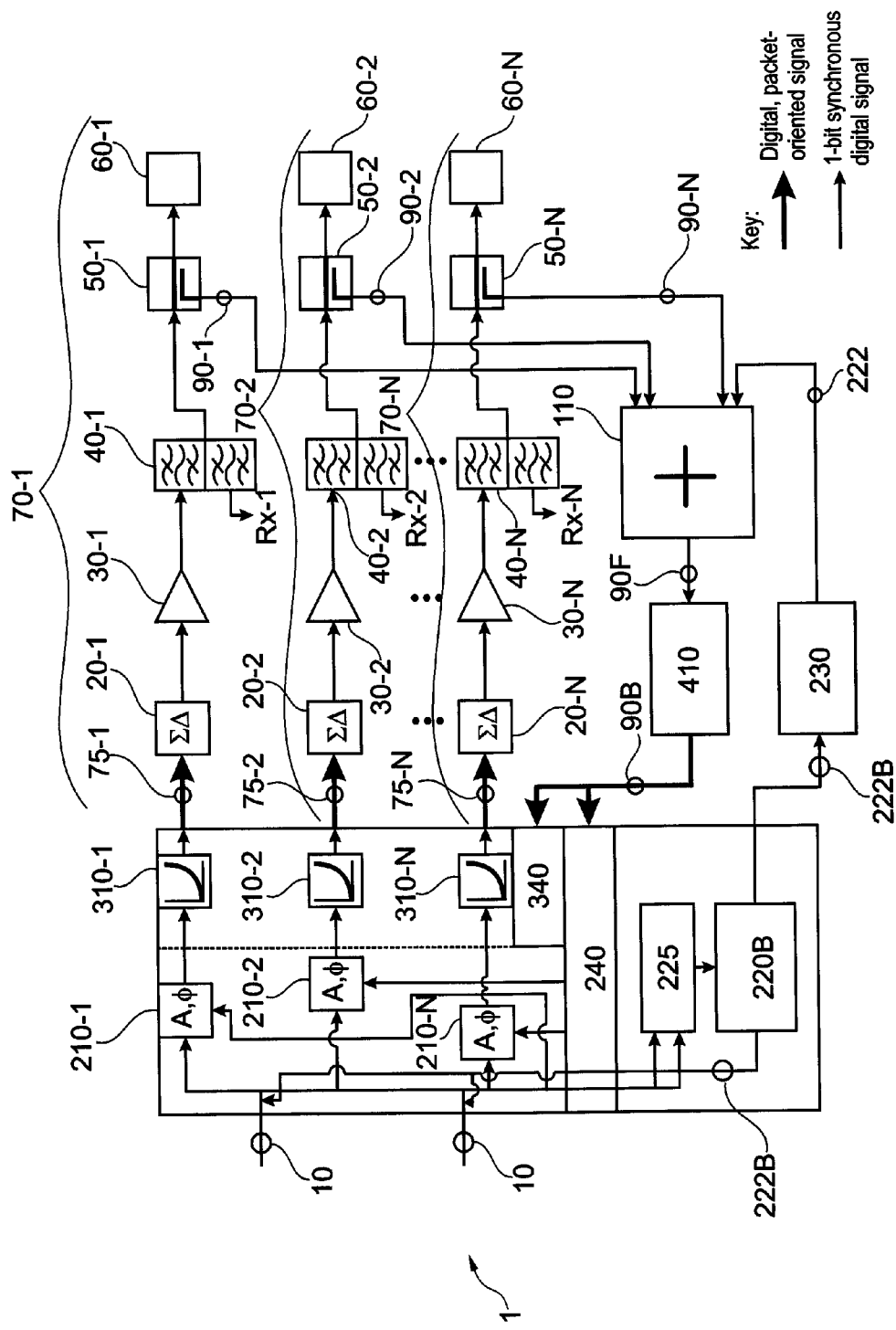
FIG. 2 shows another aspect of the radio system.

FIG. 2 shows an aspect of the radio system 1 in which the switch 100 was replaced by the combiner 110. The combiner 110 is known in the art and will not be explained in detail. The combiner 110 adds the coupled transmit signals 90-1, 90-2, . . . , 90-N with a well defined phase relation between individual ones of the coupled transmit signal 90-1, 90-2, . . . , 90-N. Therefore the combiner 100 may provide a suitable representation of all the coupled transmit signals 90-1. 90-2, . . . , 90-N. As already in FIG. 1, the calibration signal 222 is also provided to the combiner 110. Therefore the feedback signal 90F comprises the defined temporal relation present in the packetized payload signal 10. A relative phase angle added between the individual coupled transmit signals 90-1, 90-2, . . . , 90-N and the calibration signal 222 has to be chosen very carefully, in order to prevent pairs of the coupled transmit signals 90-1, 90-2, . . . , 90-N from destructive interference with each other, which would prevent the pair of the coupled transmit signal 90-1, 90-2, . . . , 90-N from being represented within the feedback signal 90F. Implementing the combiner 110 as shown in FIG. 2 may be somewhat difficult with respect to accessing all individual ones of the coupled transmit signals 90-1, 90-2, . . . , 90-N. This may hold for implementations wherein different digital predistortions 310-1, 310-2, 310-N are to be controlled and updated by the digital predistortion update module 340. In the cases that only a single digital predistortion 310 is provided (see FIG. 4) the implementation of the combiner 110 in FIG. 2 may be of advantage.

Figure 3:
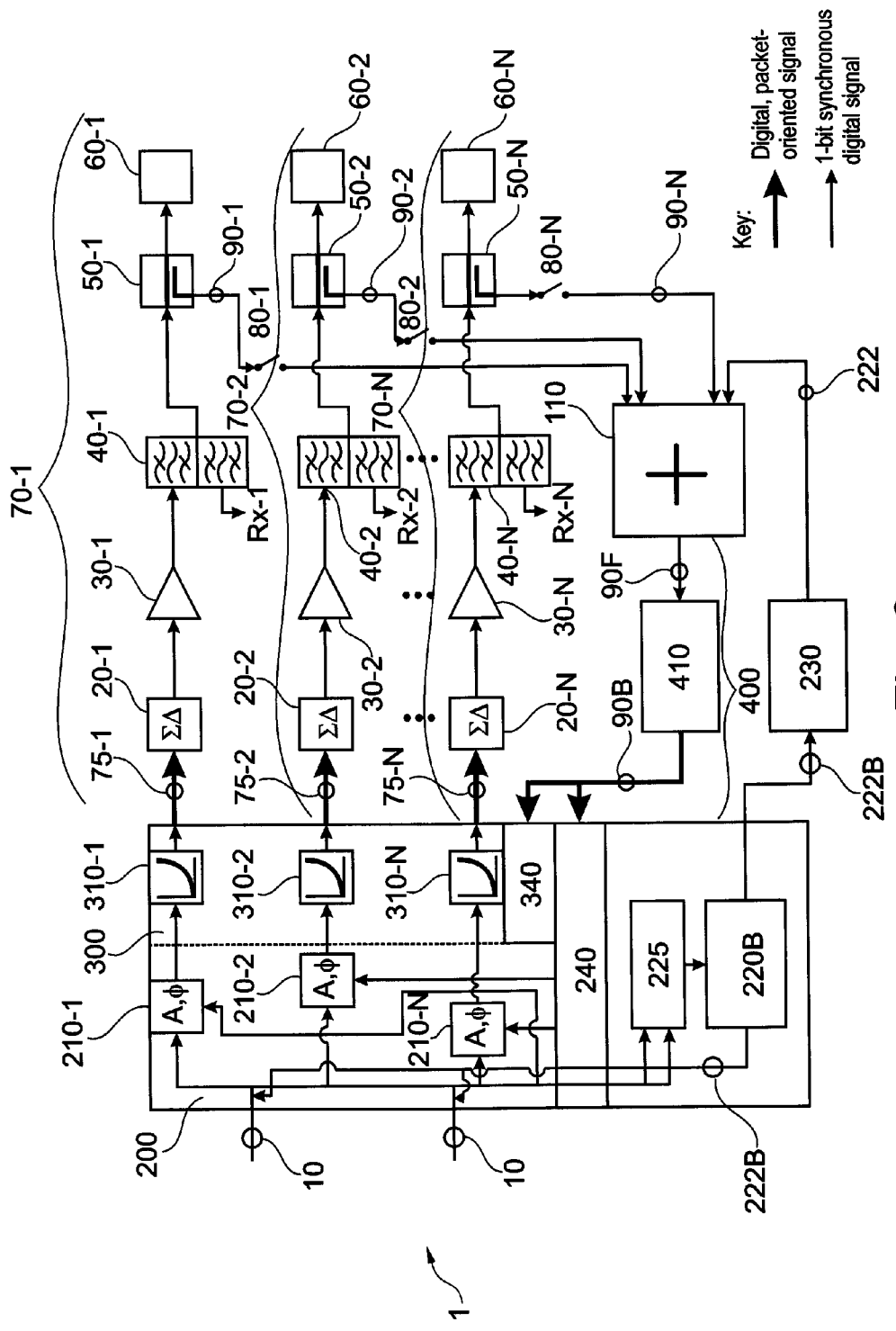
FIG. 3 shows yet another aspect of the radio system.

FIG. 3 shows a further aspect of the radio system 1. Elements of the radio system 1 already discussed are given like reference numerals. This aspect of the radio system 1 further comprises the suppressors 80-1, 80-2, . . . , 80-N. The suppressors 80-1, 80-2, . . . , 80-N may be in the form of a switch as shown in FIG. 3, a variable attenuator or a PIN diode forming an effective RF switch. The suppressors 80-1, 80-2, 80-N allow the suppression of selected ones of the coupled transmit signals 90-1, 90-2, . . . , 90-N. Therefore, it is possible to access each one of the transmit paths 70-1, 70-2, . . . , 70-N by suppressing all but the selected one of the transmit paths 70-1, 70-2, . . . , 70-N for calibration of the phase and amplitude changes and the updating of the digital predistortion 310-1, 310-2, . . . , 310-N. It is to be understood that the aspect of the radio system 1 as shown in FIG. 3 is of interest when providing individual ones of the digital predistortions 310-1, 310-2, ..., 310-N to each one of the transmit paths 70-1, 70-2, ..., 70-N.

Figure 4:
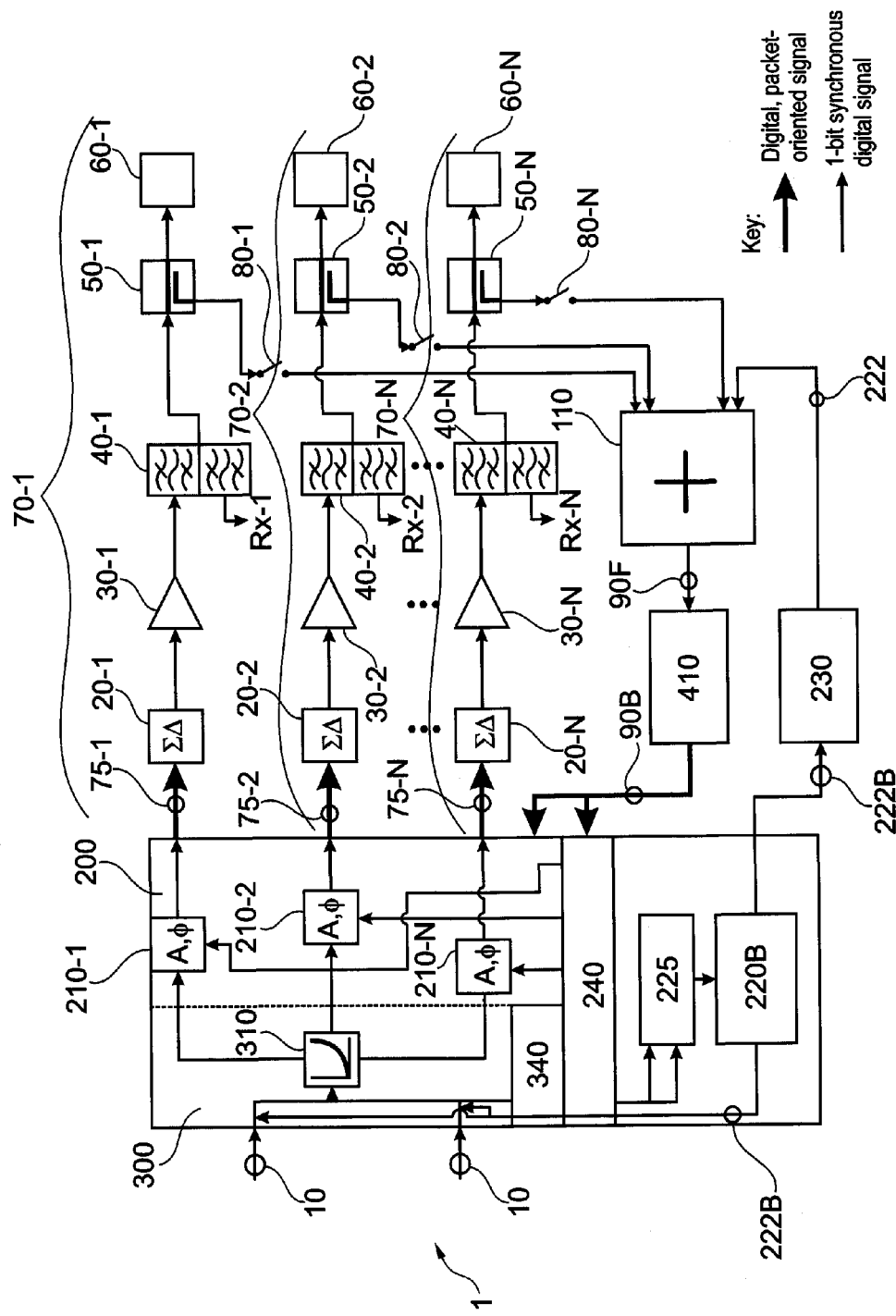
FIG. 4 shows a further radio system incorporating a common digital predistortion.

FIG. 4 shows yet another aspect of the radio system 1. It is to be noted that in the radio system 1 of FIG. 4 only a single one of the digital predistortions 310 is applied to the packetized payload signal 10. Applying only the single digital predistortion 310 to all of the transmit paths 70-1, 70-2, ..., 70-N reduces the flexibility of the digital predistortion 310 applied to the transmit paths 70-1, 70-2, ..., 70-N. At the same time system complexity in maintaining the digital predistortions 310-1, 310-2, ..., 310-N is substantially reduced. Applying the individual predistortion 310 to all the transmit paths 70-1, 70-2, ..., 70-N relies on the non-linearities within the transmit paths 70-1, 70-2, ..., 70-N to be substantially identical in order to allow an effective correction using the single digital predistortion 310. In most cases such an assumption reasonable.

The radio system 1 may further comprise a power detector (not shown). The power detector not only allows the monitoring and the measurement of the transmit power of the transmit path 70-1, 70-2, ..., 70-N pertaining to another selected coupled transmit signal 90-1, 90-2, ..., 90-N. The power detector 500 allows the measurement of a relative transmit power ratio between the transmit paths 70-1, 70-2, ..., 70-N. The use of the power detector maybe of interest in order to monitor a state of operation of the radio system 1. Would one of the power amplifiers 30-1, 30-2, ..., 30-N fail, it would be possible to detect this failure of one of the power amplifiers 30-1, 30-2, ..., 30-N using the power detector as the relative transmit power ratio would change. The concept of using the power detector is already disclosed within co-pending patent applications of the applicant (U.S. application Ser. Nos. 12/416,620, now issued as U.S. Pat. No. 8,140,007 and 12/416,639, now issued as U.S. Pat. No. 8,396,416) which are incorporated herein by reference.

The aspects of FIGS. 1-4 show the digital to analogue converters 20-1, 20-2, ..., 20-N as sigma delta converters. Without any limitation it is possible to use conventional digital to analogue converters 20-1, 20-2, ..., 20-N. The conventional digital to analogue converters 20-1, 20-2, ..., 20-N require an up-converter. The up-converter may further comprise a filtering capability.

The radio system 1 as discussed within FIGS. 1-4 provided the feedback path 400 for all the transmit paths 70-1, 70-2, ..., 70-N. Generally it is more expensive to provide several ones of the feedback paths 400-1, 400-2, 400-N when manufacturing the radio system 1. In an extreme case N instances of the radio system 1 as described with respect to FIGS. 1-4 may be provided. Each one of the N instances of the radio system 1 would in the extreme case have a single transmit path 70-1, 70-2, ..., 70-N and an individual one of the feedback path 400.

Providing the instances of the radio system 1 is more efficient when implementing the radio system 1 with a high level of integration. The high level of integration may be present for indoor systems. It may be cheaper and simpler to replicate the complete transmit paths 70-1, 70-2, 70-N and the feedback paths 400-1, 400-2, ..., 400-N, i.e. the complete N instances of the radio system 1 with the high level of integration present. In the extreme case of the N instances of the radio system 1, there is no need for the switch 100 to be provided.

For all aspects of the radio station 1 as discussed so far it was assumed that the filter 40-1, 40-2, ..., 40-N comprises a filtering characteristics spectrally wide enough in the transmit direction to allow through all sideband intermodulation distortion information required for the updating of the digital predistortions 310-1, 310-2, ..., 310-N to work reliably. In many cases it may not be true that the filtering characteristics of the filters 40-1, 40-2, ..., 40-N are spectrally wide enough in this respect.

Figure 5:
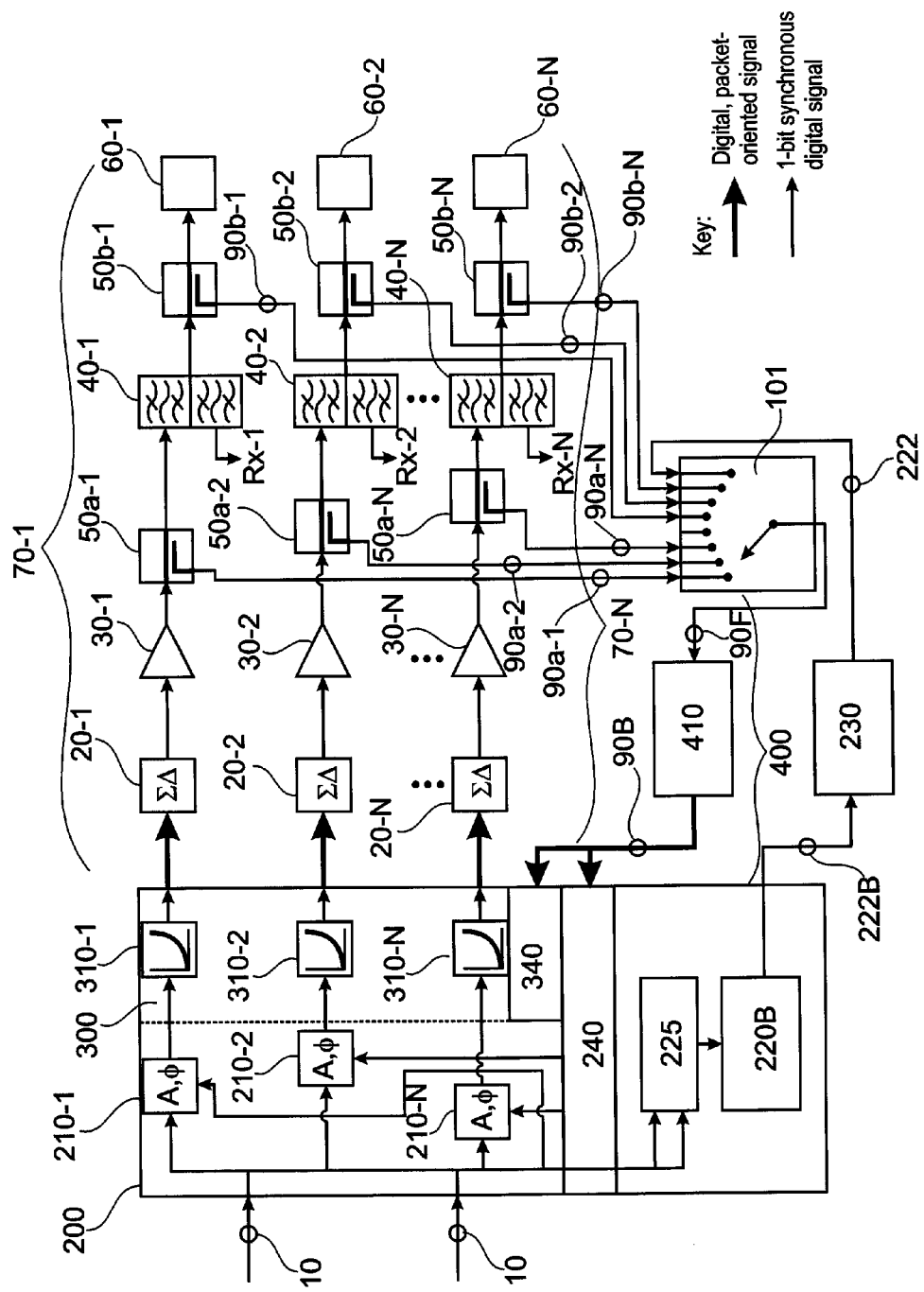
FIG. 5 shows an aspect of the radio system comprising two sets of couplers.

FIG. 5 shows an aspect of the radio system 1 which may be of interest when implemented filtering characteristics of the filters 40-1, 40-2, ..., 40-N are spectrally not wide enough as described above. The aspect shown in FIG. 5 comprises a first set of couplers 50a-1, 50a-2, ..., 50a-N arranged before the filters 40-1, 40-2, ..., 40-N in a transmit direction. The first set of couplers 50a-1, 50a-2, ..., 50a-N allows extracting a first group of coupled transmit signals 90a-1, 90a-2, ..., 90a-N. The first group of coupled transmit signals 90a-1, 90a-2, ..., 90a-N reflects the output of the amplifiers 30-1, 30-2, ..., 30-N. A second group of transmit signals 90b-1, 90b-2, ..., 90b-N reflects the transmit signals 75-1, 75-2, ..., 75-N relayed by the antenna elements 60-1, 60-2, ..., 60-N. The switch 100 (as shown in FIG. 1) has been replaced with a switch 101 comprising one output and 2N+1 input terminals. Therefore for each one of the transmit paths 70-1, 70-2, ..., 70-N it is possible to forward either a selected one of the first group of coupled transmit signals 90a-1, 90a-2, ..., 90a-N or a selected one of the second group of coupled transmit signals 90b-1, 90b-2, ..., 90b-N. The calibration signal 222 may as well be forwarded on one of the 2N+1 terminals of the switch 101. The first group of coupled transmit signals 90a-1, 90a-2, ..., 90a-N is used for the updating of the digital predistortions 310-1, 310-2, ..., 310-N. The second group of coupled transmit signals 90b-1, 90b-2, ... 90b-N is used for calibrating the phase and amplitude changes 210-1, 210-2, ..., 210-N.

Figure 6:
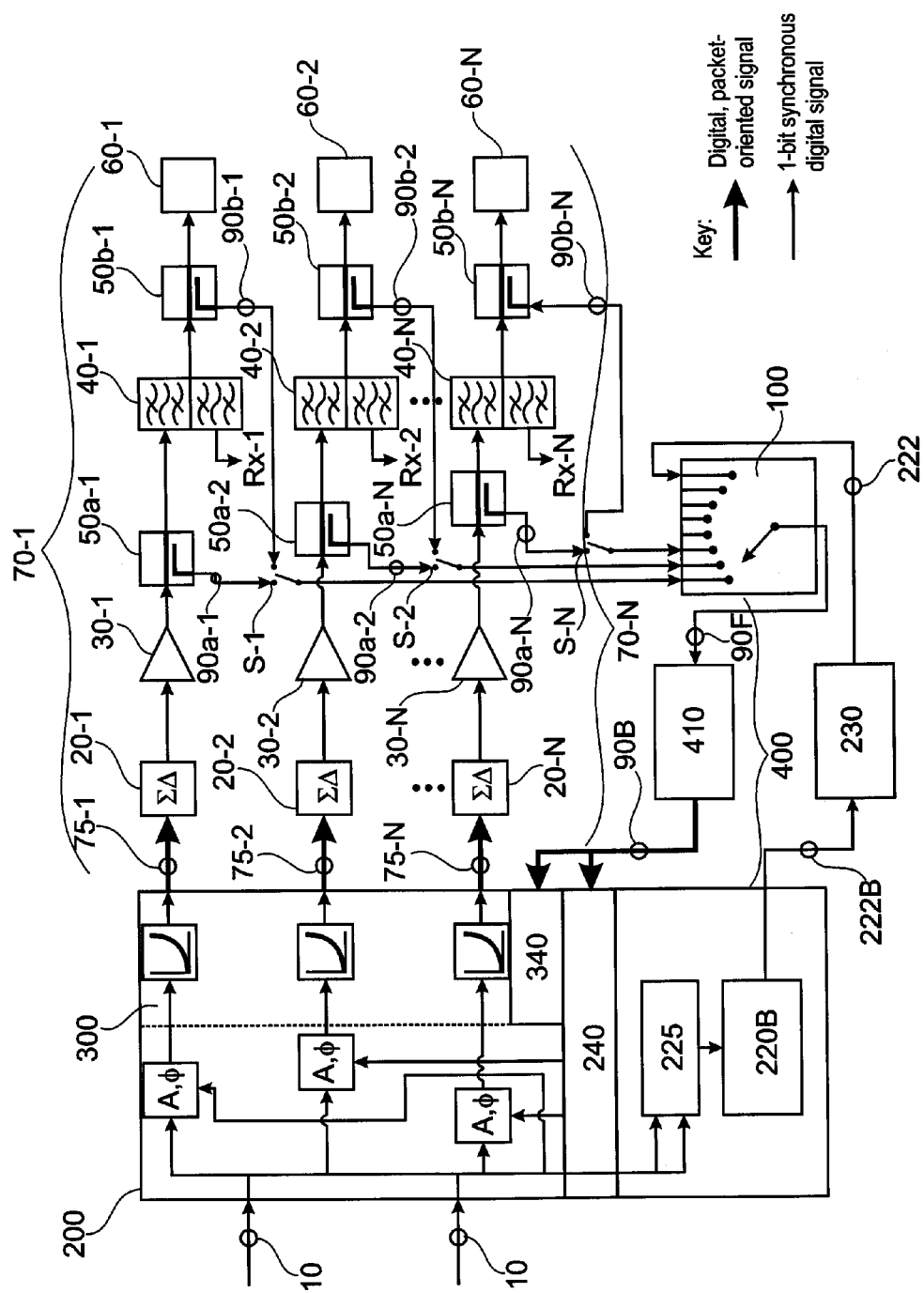
FIG. 6 shows a variant of the radio system comprising two sets of couplers.

FIG. 6 shows a variant of the aspect of the radio system 1 described with respect to FIG. 5. In FIG. 6 switches S-1, S-2, ..., S-N are disposed for each one of the transmit paths 70-1, 70-2 ..., 70-N. The switches S-1, S-2, ..., S-N allow switching between the first group of coupled transmit signals 90a-1, 90a-2, ..., 90a-N and the second group of coupled transmit signals 90b-1, 90b-2, ..., 90b-N for each one of the transmit paths 70-1, 70-2, ..., 70-N, individually. It is to be understood that the switch 100 comprising N+1 entry ports is sufficient for the radio station 1 as shown in FIG. 6. Typically the switches S-1, S-2, ..., S-N are located very close to the antenna elements 70-1, 70-2, ..., 70-N and therefore may well be some distance from the calibration unit 200, the digital predistortion unit 300, the calibration update unit 240 and the digital predistortion update unit 340. Providing the switches S-1, S-2, ..., S-N may hence halve a length of lines from the first and second group of couplers 50a-1, 50a-2, ..., 50a-N, 50b-1, 50b-2, ..., 50b-N to the switch 100, 101 and hence the feedback path 400. The radio system 1 requiring only half the length of the lines will therefore be cheaper to manufacture. The lines may as a non-limiting example comprise coax cable, fibre links, micro strips and the like.

Figure 7:
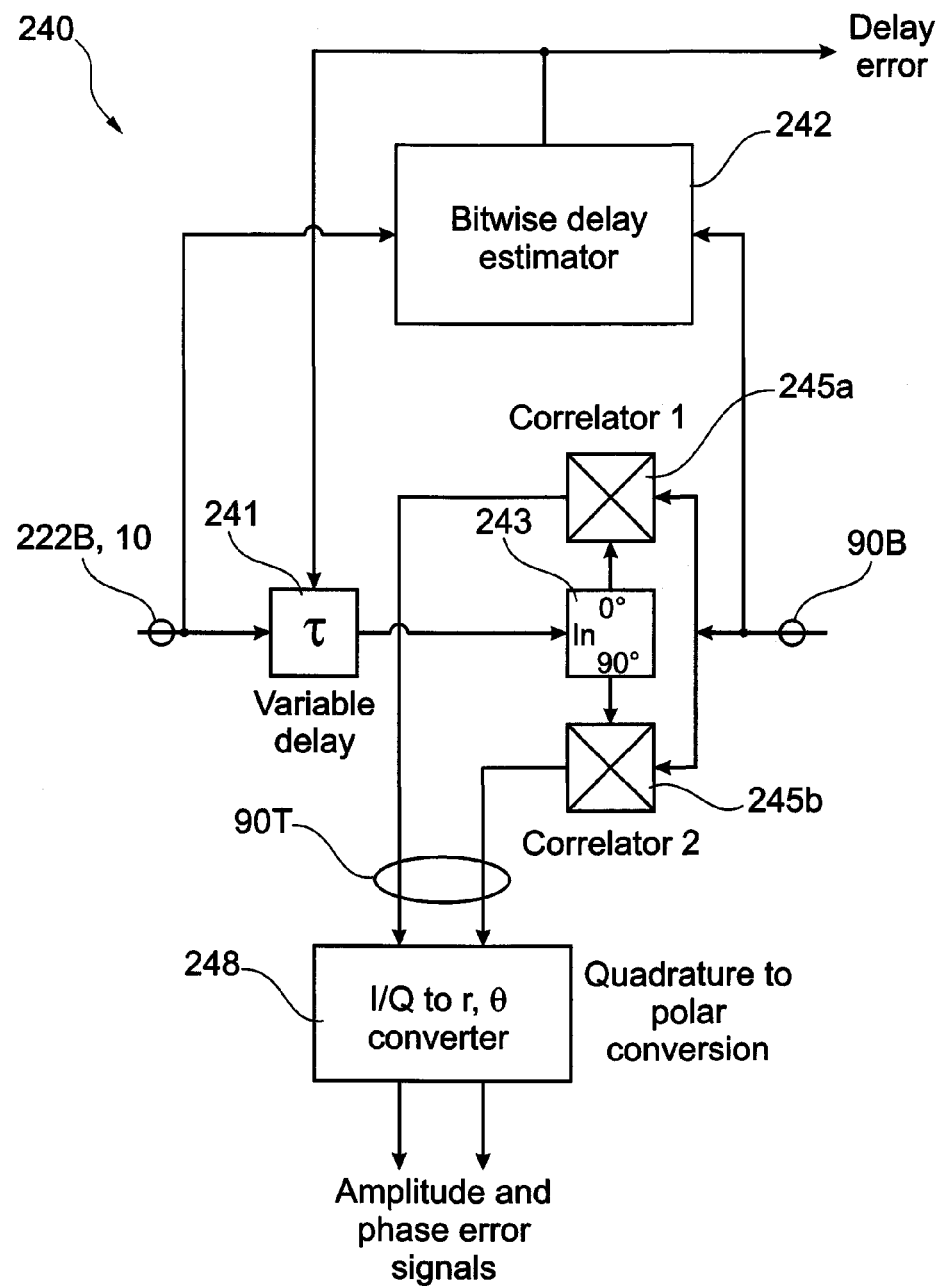
FIG. 7 shows a detailed view of a calibration update module.

FIG. 7 shows the calibration update unit 240 of the radio system 1 in more detail. The packetized payload signal 10 is provided to the calibration update unit 240 and a variable delay 241 is added to the packetized payload signal 10. The delay estimator 242 is adapted to estimate a delay between the packetized payload signal 10 and the transmit signals 75-1, 75-2, ..., 75-N being relayed by the radio system 1. The delay estimated by the delay estimator 242 provides a measure for a transit time needed for the packetized payload 10 reaching the digital radio interface until a corresponding transmit signal 75-1, ..., 75-N is being relayed by the antenna elements 60-1, 60-2, ..., 60-N. The delay estimator 242 is further used in order to give a first estimate of the variable time delay 241 that needs to be added to the packetized payload signal 10 before correlating the in phase component I and the quadrature component Q of the (delayed) packetized payload signal 10 with the feedback signal. Most conveniently the correlation is carried out using the base band feedback signal 90B downstream of the calibration signal demodulator 410 (see FIGS. 1-6). It would be possible as well to carry out the correlating at the intermediate frequency. Using the intermediate frequency would require both the feedback signal and the (delayed) payload signal 10 to be provided at the intermediate frequency or to be suitably up-converted or down-converted to the intermediate frequency, as required.

The calibration update unit 240 further comprises a converter module 248. The converter module 248 converts the transmit deviation 90T provided in an in phase I and a quadrature Q format into the transmit deviations 90T in a polar format comprising a phase deviation and an amplitude deviation. The transmit deviations 90T represented in the polar format provide the phase and the amplitude deviation that is accumulated along the transmit paths 70-1, 70-2, . . . , 70-N and the feedback path 400 of the radio system 1.

Typically, the radio system 1 is connected to one or more antenna elements 60-1, 60-2, . . . , 60-N such that a defined phase and amplitude relation between individual ones of the transmit paths 70-1, 70-2, . . . , 70-N, can be provided. The defined phase and amplitude relation between the individual ones of the transmit paths 70-1, 70-2, . . . , 70-N is required for techniques such as beam forming, beam tilting, a direction of arrival (DoA) detection, as known in the art. The radio system 1 is adapted to carry out these techniques. The transmit deviations 90T determined by the calibration update module 240 serve as a basis to apply phase and amplitude changes 210-1, 210-2, . . . , 210-N to yield the defined phase and amplitude relation between the individual ones of the transmit paths 70-1, 70-2, . . . , 70-N.

It is to be understood that the provision of the base band calibration signal generator 222B will provide the feedback signal 90F and the base band feedback signal 90B in synchronisation with the packetized payload signal 10 as is required for the calibration of the phase and amplitude changes 210-1, 210-2, . . . , 210-N.

It is to be noted that the transmit deviations 90T may need to be corrected for a portion of the transmit deviations 90T pertaining to the coupled transmit signals 90-1, . . . , 90-N travelling from the couplers 50-1, 50-2, . . . , 50-N to the switch 100, along the transmit path 400 reaching the calibration update unit 240 and/or the digital predistortion update unit 340. Clearly the design of the radio system 1 will allow estimating the portion of the transmit deviations 90T not pertaining to the relaying of the transmit signals 75-1, . . . , 75-N being relayed along the transmit paths 70-1, 70-2, . . . , 70-N.

Figure 8:
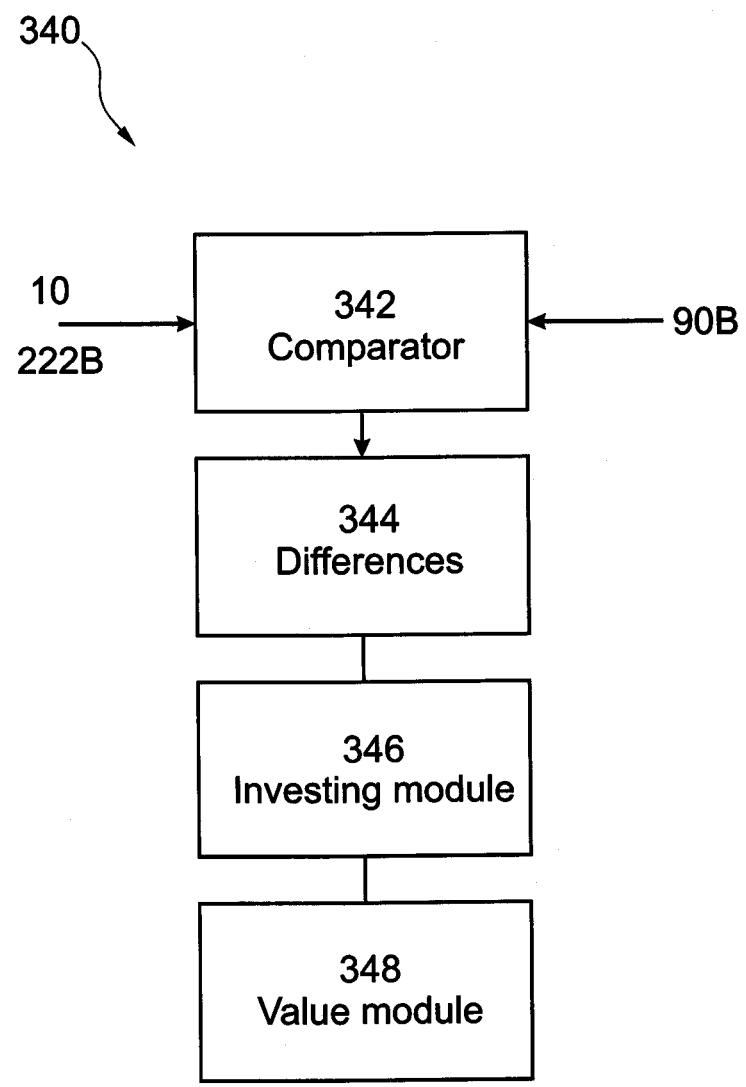
FIG. 8 shows a detailed view of a digital predistortion update module.

FIG. 8 shows the digital predistortion update module 340 for updating the digital predistortions 310-1, 310-2, . . . , 310-N applied to the packetized payload signal 10. The digital predistortions 310-1, 310-2, . . . , 310-N are typically represented by tables storing polynomial coefficients reflecting non-linearities of the transmit paths 70-1, 70-2, . . . , 70-N. Within FIGS. 1-3, 5 and 6 there is an individual one of the predistortions 310-1, 310-2, . . . , 310-N provided for each one of the transmit paths 70-1, 70-2, . . . , 70-N. Nevertheless, it is possible to provide a single one of the digital predistortions 310-1, 310-2, . . . , 310-N to more than one of the transmit paths 70-1, 70-2, . . . , 70-N as shown in FIG. 4.

The concept of digital predistortion is well know in the art and will not be explained in detail here. In any transmit path 70-1, 70-2, . . . , 70-N typically the amplifier 40-1, 40-2, . . . , 40-N causes non-linearities in the transfer characteristics of the transmit path 70-1, 70-2, . . . , 70-N. The concept of digital predistortion provides an "inverted non-linearity" to the packetized payload signal 10 that is to be relayed along the transmit paths 70-1, 70-2, . . . , 70-N. Providing this "inverted non-linearity" will correct for the non-linearities accumulated along the transmit paths 70-1, 70-2, . . . , 70-N. Therefore, the concept of digital predistortion allows correcting for the non-linearities introduced by the amplifier 40-1, 40-2, . . . , 40-N. Consequently the digital predistortion 310-1, 310-2, . . . , 310-N helps to linearise the transfer characteristics of the radio system 1.

FIG. 8 shows the digital predistortion update module 340. The digital predistortion update module 340 updates the coefficients representing the digital predistortions 310-1, 310-2, . . . , 310-N. The digital predistortion update module 340 receives the packetized payload signal 10 and the base band feedback signal 90B. Without any limitation it is possible to use a version of the packetized payload signal 10 at any intermediate frequency IF between the base band frequency and the frequency band of transmission of the radio system 1. A comparator 342 compares the packetized payload signal 10 and the base band feedback signal 90B. The base band feedback signal 90B requires at least a portion of non-zero mean value for the updating of the digital predistortions 310-1, 310-2, . . . , 310-N as the updating of the digital predistortions 310-1, 310-2, . . . , 310-N comprises averaging over several samples of the feedback signal 90B. It surely is a fair assumption to make for the packetized payload signal 10 to comprise portions of non-vanishing mean values when updating the digital predistortions 310-1, 310-2, . . . , 310-N.

The comparison between the packetized payload signal 10 and the base band feedback signal 90B may comprise correlating the packetized payload signal 10 and the base band feedback signal 90B. As before, it is possible to use a version of the payload signal 10 at the intermediate frequency IF between the base band frequency and the frequency band of transmission of the radio system 1. Typically the comparator 342 provides differences 344 between the packetized payload signal 10 and the base band feedback signal 90B. As stated above, the comparator 342 may derive differences 344 between the packetized payload signal 10 when entering the radio system 1 and the base band feedback signal 90B after having travelled the transmit paths 70-1, 70-2, . . . , 70-N and the feedback path 400.

The calibration of the phase and amplitude changes 210-1, 210-2, . . . , 210-N and the updating of the digital predistortion 310-1, 310-2, . . . , 310-N may be carried out during normal operation of the radio system 1. The differences 344 comprise a difference in amplitude over the frequency range of the radio system 1. It is to be understood that the differences in amplitude are represented in the base band when comparing the packetized payload 10 and the base band feedback signal 90B. Again the comparison may without any limitation be carried out at any other intermediate frequency IF. The differences in amplitudes in the base band will represent the differences in amplitude in the frequency band of transmission of the radio station 1. An inverting module 346 inverts the differences 347 provided by the comparator 342. A value module 348 uses an output from the inverting module 346 in order to derive coefficient values that represent the predistortions 310-1, 310-2, . . . , 310-N that are applied to the packetized payload signal 10.

Figure 9A:
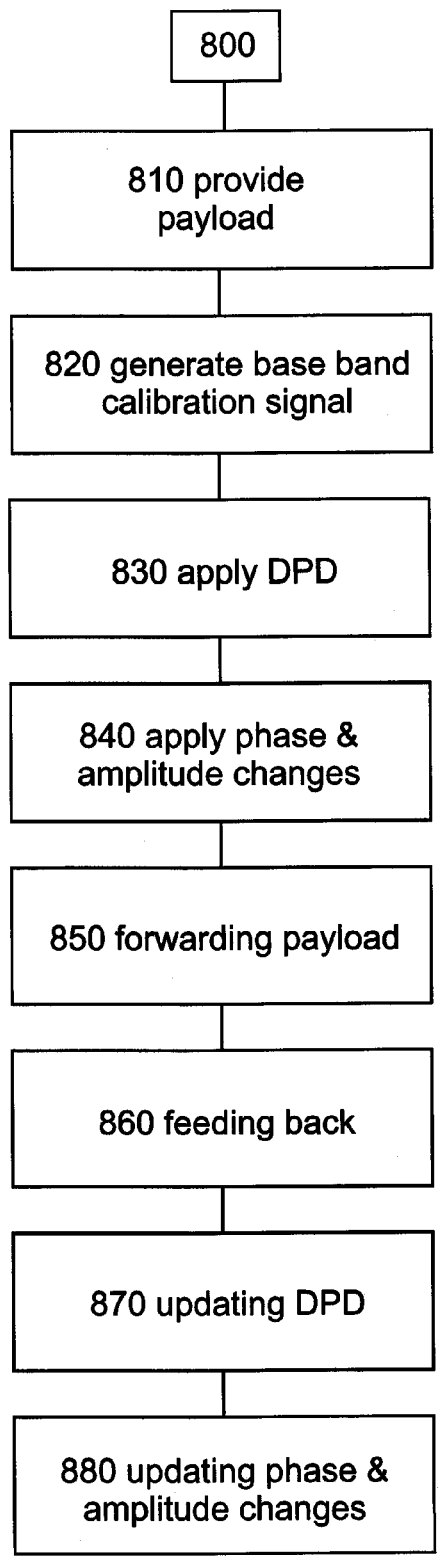
FIG. 9*a* shows a flow chart of the method for relaying packetized radio signals.

The present system further provides a method 800 for relaying radio packetized signals. FIG. 9a shows a flow chart of the method 800.

In a step 810 the packetized payload signal 10 is provided. The packetized payload signal 10 may, for example, comprise the in-phase component I and the quadrature component Q as pairs (I, Q), as is known in the art. The packetized payload signal 10 may, for example, be provided at a digital radio interface DRI, as explained above. In a step 820 the base band calibration signal 222B is generated. Properties of the base band calibration signal 222B will be reflected in the calibration signal 222 generated by the calibration modulator 230. As mentioned above, the generating 820 of the based band calibration signal 222B has been disclosed previously. It is of interest for the base band calibration signal 222B to comprise a portion of non-vanishing mean value when used for calibrating the digital predistortion 310-1, 310-2, . . . , 310-N. As mentioned before the packetized payload signal 10 may conveniently be used for the updating of the digital predistortions 310-1, 310-2, . . . , 310-N. The base band calibration signal 222B will also comprise the portion of the base band calibration signal 222B pertaining to the calibration of the phase and amplitude changes 210-1, 210-2, . . . , 210-N. The portion of the base band calibration signal 222B pertaining to the calibration of the phase and amplitude changes 210-1, 210-2, . . . , 210-N will be of a vanishing mean value. Methods of generating such a signal forming the calibration signal 222 and/or the base band calibration signal 222B are known in the art.

In a step 830 the digital predistortion 310-1, 310-2, . . . , 310-N is applied to the packetized payload signal 10. In a step 840 the phase and amplitude changes 210-1, 210-2, . . . , 210-N are applied to the packetized payload signal 10. In a step 850 the packetized payload signal 10 is forwarded along the transmit path 70-1, 70-2, . . . , 70-N. A step 860 comprises feeding a selected one of the coupled transmit signals 90-1, 90-2, . . . , 90-N back into the feedback path 400 as the feedback signal 90B. A step 870 comprises an updating of the digital predistortions 310-1, 310-2, . . . , 310-N. A step 880 comprises an updating of the phase and amplitude changes 210-1, 210-2, . . . , 210-N.

In the step 830 of applying the digital predistortion 310-1, 310-2, . . . , 310-N it may be of interest to use predefined values describing the digital predistortion 310-1, 310-2, . . . , 310-N when first applying the digital predistortion 310-1, 310-2, . . . , 310-N. It may be more reliable to update the phase and amplitude changes 210-1, 210-2, . . . , 210-N in the step 880 after the digital predistortions 310-1, 310-2, . . . , 310-N are correctly updated in step 870; so that any non-linearity is correctly removed in the step 870 before the amplitude and phase changes 210-1, 210-2, . . . , 210-N are updated. This order of the steps 870 and 880 is only of relevance once the digital predistortions 310-1, 310-2, . . . , 310-N are drastically out of calibration. If the updating of the phase and amplitude changes 880 was to be carried out before the updating 870 of the digital predistortion 310-1, 310-2, . . . , 310-N an extra run of the method 800 may be required in order to correctly calibrate the digital predistortion 310-1, 310-2, . . . , 310-N and the phase and amplitude changes 210-1, 210-2, . . . , 210-N.

Figure 9B:
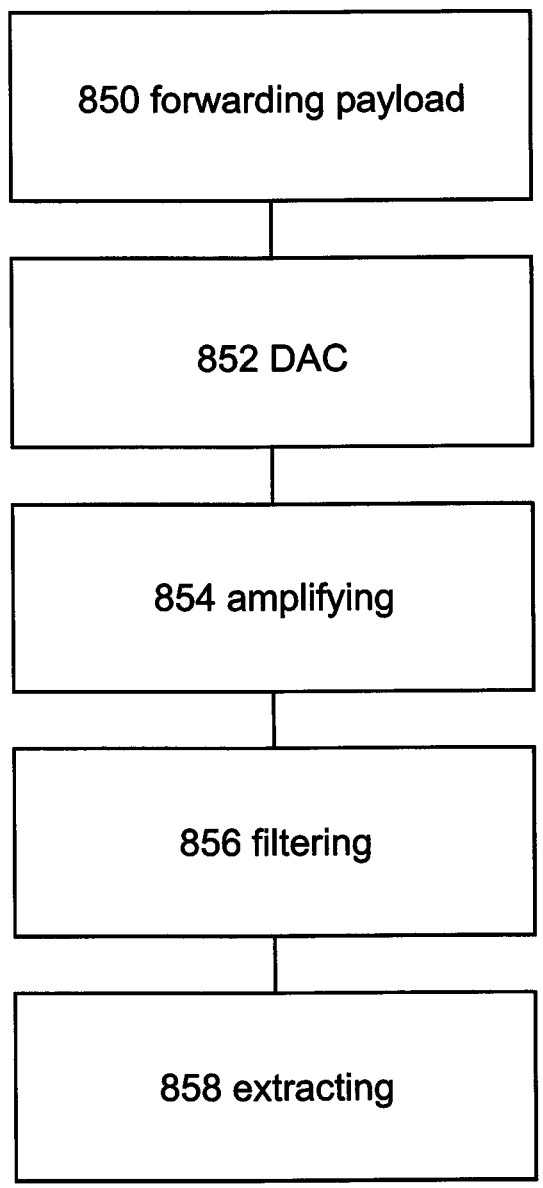
FIG. 9*b* shows a flow chart illustrating a step of forwarding a packetized payload signal.

FIG. 9b shows further details of the step 850 of forwarding the packetized payload signal 10. The step 850 comprises a step 852 of digital to analogue converting the transmit signal 75-1, 75-2, . . . , 75-N. The step of digital to analogue converting 852 may comprise using sigma delta digital to analogue convertors 20-1, 20-2, . . . , 20-N. It will be appreciated that the use of the sigma delta digital to analogue convertors does not require an up-converting step and a filtering step as is required with traditional digital to analogue converters.

In a step 854 the transmit signal 75-1, 75-2, . . . , 75-N is amplified. The amplifying step 854 may be carried out using the amplifier 30-1, 30-2, . . . , 30-N. The step 850 furthermore comprises a step of filtering 856 the transmit signal 75-1, 75-2, . . . , 75-N. The step of filtering 856 may comprise using duplex filters 40-1, 40-2, . . . , 40-N. The use of the duplex filters 40-1, 40-2, . . . , 40-N is of interest when dealing with a transmit and receive radio system 1 in order to separate transmit signals 90-1, 90-2, . . . , 90-N and receive signals. A step 858 comprises extracting a coupled transmit signal 90-1, 90-2, . . . , 90-N from the transmit signals 75-1, 75-2, . . . , 75-N.

Figure 9C:
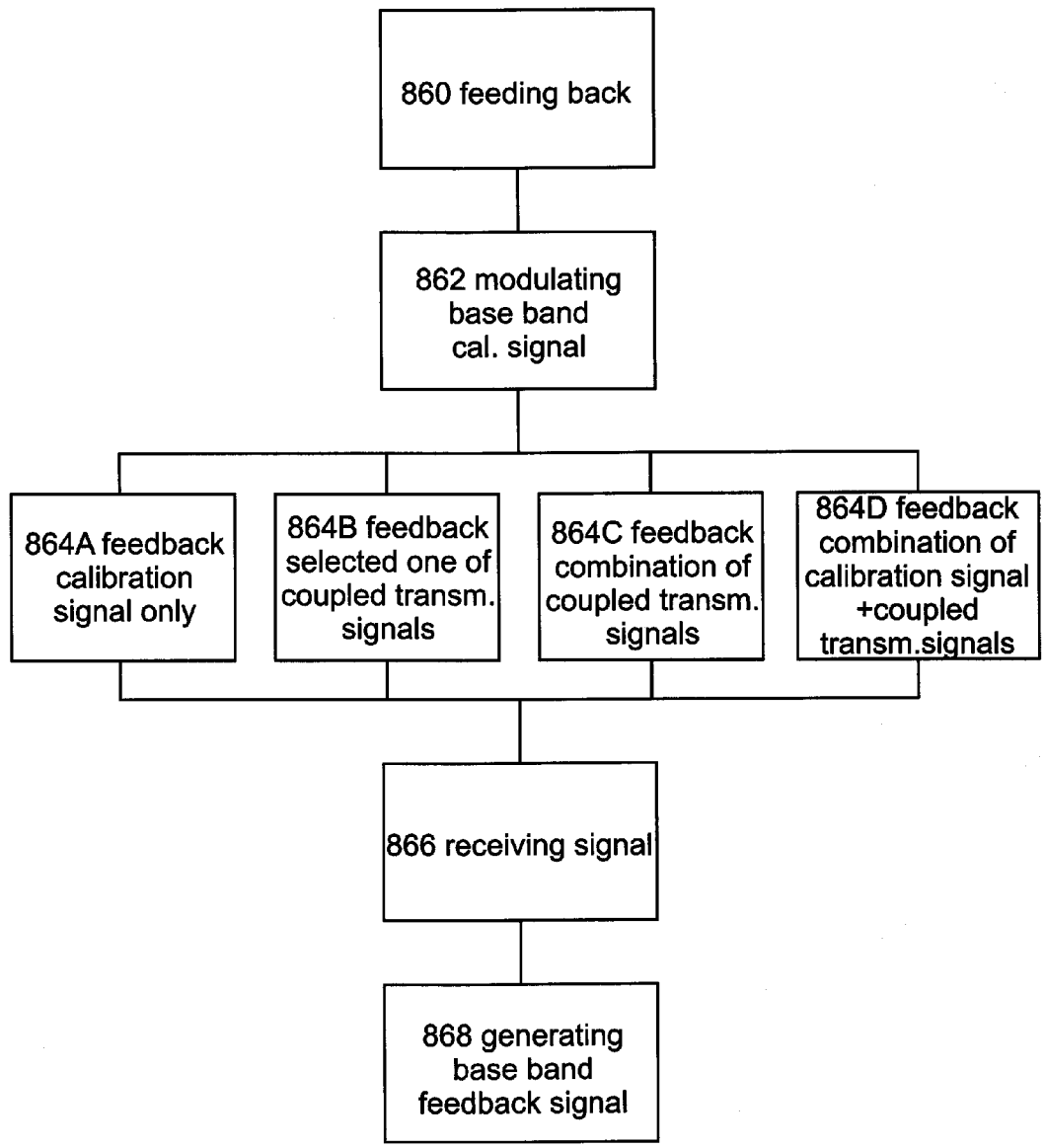
FIG. 9*c* shows a flow chart illustrating a step of feeding back a feedback signal.

FIG. 9c shows further details of the step 860 of feeding back the feedback signal 90F. The step 860 comprises a step 862 of modulating the base band calibration signal 222B. The modulating step 862 of modulating the base band calibration signal 222B yields a calibration signal 220. Subsequently the method provides four different alternatives branching out in four different steps of feeding back the feedback signal 90F. In a step 864A the calibration signal 222 is fed back only as a first alternative. The feedback 864A of the calibration signal 222 only may be of interest in order to calibrate the feedback path 400 as discussed above. As a second alternative in a step 864B a selected one of the coupled transmit signals 90-1, 90-2, . . . , 90-N is forwarded to the feedback path 400 as the feedback signal 90F. The step 864B may be of interest when using the radio system 1 incorporating the switch 100 as shown in FIG. 1.

A third option comprises a step 864C of feeding back a combination of coupled transmit signals 90-1, 90-2, . . . , 90-N as the feedback signal 90F. The feedback step 864C of feeding back the combination of the coupled transmit signals 90-1, 90-2, . . . , 90-N is of interest when the radio system 1 comprises the combiner 110 as discussed with respect to FIGS. 2-4.

According to a fourth option in a step 864D a combination of the calibration signal 222 and a combination of coupled transmit signals 90-1, 90-2, . . . , 90-N is forwarded as the feedback signal 90F. The step 864D is of interest in combination with the radio system 1 as shown in FIGS. 2-4.

The steps 864A, 864B, 864C, 864D are followed by a common step 866 of receiving the feedback signal 90F at the feedback signal demodulator 410. In a step 868 the base band feedback signal 90B is generated.

Figure 9D:
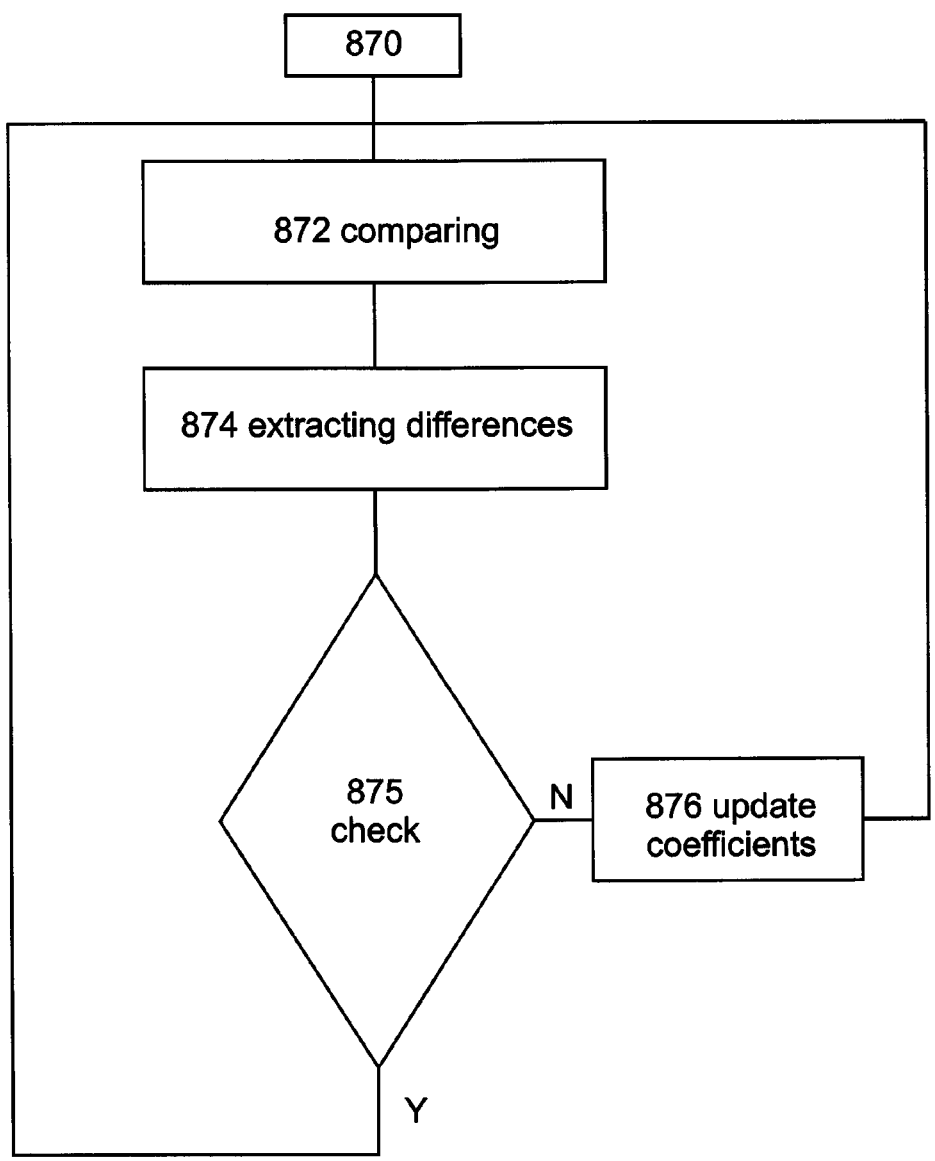
FIG. 9*d* shows a flow chart illustrating a step of updating the digital predistortion.

FIG. 9d shows the step 870 of the updating of the digital predistortion 310-1, 310-2, . . . , 310-N in more detail. The step 870 comprises a step of comparing the base band feedback signal 90B to the packetized payload signal 10. The step of comparing 872 may further comprise a correlating of the packetized payload signal 10 with the base band feedback signal 90B. The step 872 of comparing may further comprise an averaging over several samples of the feedback signal 90F and/or the base band feedback signal 90B. The portions of the calibration signal 222 pertaining to the phase and amplitude changes 210-1, 210-2, . . . , 210-N within the feedback signal 90F will cancel with the averaging over several samples, as mentioned before.

In a step 874 differences 344 between the packetized payload signal 10 and the base band feedback signal 90B are extracted. The differences 344 form the basis for the calculation of the digital predistortions 310-1, 310-2, . . . , 310-N, in order to linearise the transfer characteristics of the transmit paths 70-1, 70-2, . . . , 70-N. In a step 875 it is checked whether or not the differences 344 extracted in the step 874 are below a predefined threshold. In case the differences 344 are below the predefined threshold, no update of the digital predistortions 310-1, 310-2, . . . , 310-N is required. If in turn the differences 344 extracted in the step 874 are above the predefined threshold, a step 876 of updating the digital predistortion 310-1, 310-2, . . . , 310-N is carried out. The step 876 of updating the digital predistortion 310-1, 310-2, . . . , 310-N, provides a new set of coefficients, describing a correction needed in order to lift non-linearity of the transfer characteristics of the transmit paths 70-1, 70-2, . . . , 70-N. Methods to derive an inversion of the differences 344 are known in the art.

After the step 876 the method returns to the comparing step 872 of comparing.

Figure 9E:
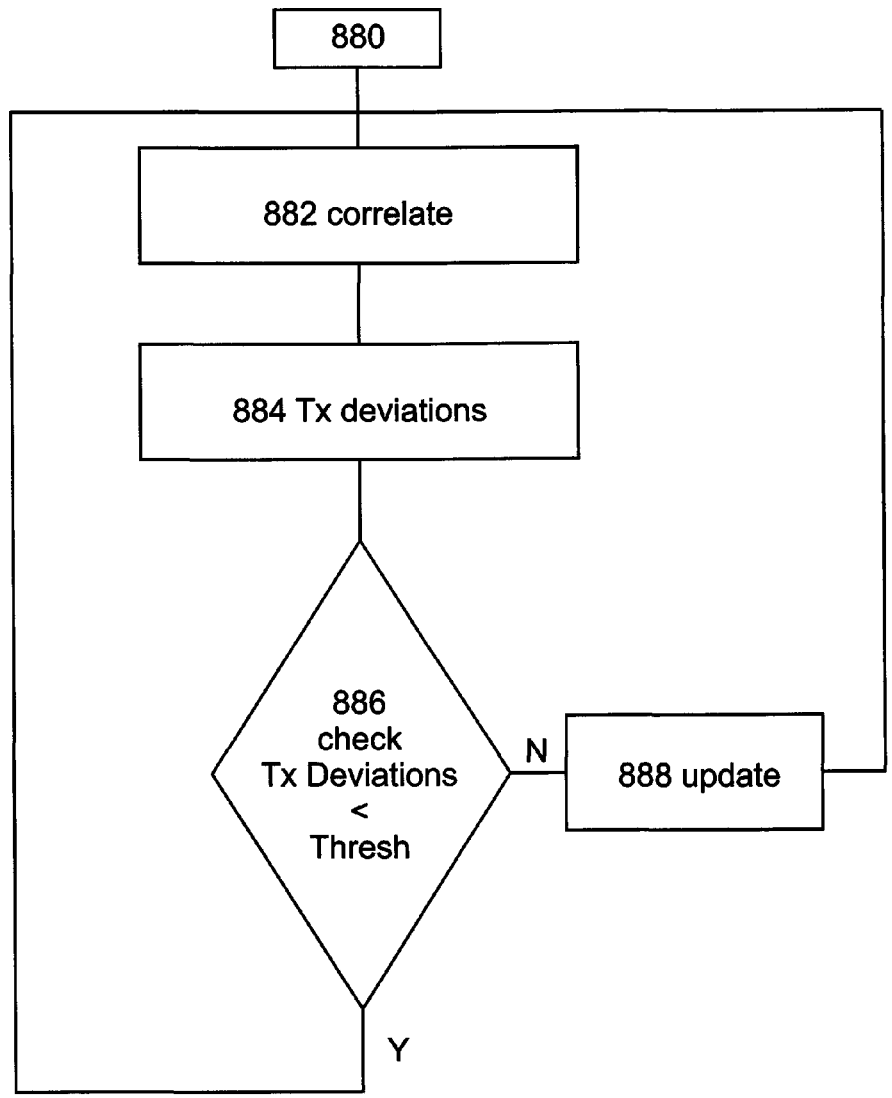
FIG. 9*e* shows a flow chart illustrating a step of updating the phase and amplitude changes.

FIG. 9e shows a diagram describing details of the step 880 of updating the phase and amplitude changes 210-1, 210-2, . . . , 210-N. A step 882 comprises correlating the packetized payload signal 10 and the base band feedback signal 90B. As stated before the correlating may comprise correlating the base band calibration signal 222B to the calibration signal 222B comprised within base band feedback signal 90B. It is to be understood that the feedback signal 90F, the base band feedback signal 90B and the packetized payload signal 10 are synchronised by the synchronisation unit 225. In a step 884 the transmit deviations 90T are derived from the signals correlated in the step 882. It is to be understood that the transmit deviations 90T may comprise transit times needed for the payload signal 10 entering the DRI until a corresponding transmit signal 75-1, . . . , 75-N is being relayed by the radio system 1. In a step 886 it is checked if the transmit deviations 90T are below a predefined threshold. In case the transmit deviations 90T are below the predefined threshold the method 800 returns to the step 882. In case the transmit deviations 90T are not below the predefined threshold in a step 888 an updating of the phase and amplitude changes 210-1, 210-2, . . . , 210-N is carried out, responsive to the transmit deviations 90T derived in the step 886. The updating 888 of the phase and amplitude changes 210-1, 210-2, . . . , 210-N is well known in the art and shall not be discussed any further.

It is to be understood that the method 800 has been explained for the calibration of the digital predistortions 310-1, 310-2, . . . , 310-N and the phase and amplitude changes 210-1, 210-2, . . . , 210-N for an individual one of the transmit paths 70-1, 70-2 . . . , 70-N with respect to the radio system 1. Only the aspect of the radio system 1 as shown in FIGS. 2-4 all the transmit paths 70-1, 70-2, . . . , 70-N will be calibrated after a first iteration of the method 800 as described. For all other aspects of the radio system 1 several iterations of the method 800 as described will be required for all the transmit paths 70-1, 70-2, . . . , 70-N to be calibrated.

While various aspects of the present invention have been described above, it should be understood that they have been presented by way of example, and not limitation. It will be apparent to persons skilled in the relevant arts that various changes in form and detail can be made therein without departing from the scope of the invention. For example, any bipolar transistors depicted in the drawings and/or described in the text could be field effect transistors, and vice versa. The resonators need not be a LC-type resonator, but also any other type of suitable resonator, such as a tank or a surface wave resonator. In addition to using hardware (e.g., within or coupled to a Central Processing Unit ("CPU"), microprocessor, microcontroller, digital signal processor, processor core, System on Chip ("SOC"), or any other device), implementations may also be embodied in software (e.g., computer readable code, program code, and/or instructions disposed in any form, such as source, object or machine language) disposed, for example, in a computer usable (e.g., readable) medium configured to store the software. Such software can enable, for example, the function, fabrication, modelling, simulation, description and/or testing of the apparatus and methods described herein. For example, this can be accomplished through the use of general programming languages (e.g., C, C++), hardware description languages (HDL) including Verilog HDL, VHDL, and so on, or other available programs. Such software can be disposed in any known computer usable medium such as semiconductor, magnetic disk, or optical disc (e.g., CD-ROM, DVD-ROM, etc.). The software can also be disposed as a computer data signal embodied in a computer usable (e.g., readable) transmission medium (e.g., carrier wave or any other medium including digital, optical, or analog-based medium). Embodiments of the present invention may include methods of providing the apparatus described herein by providing software describing the apparatus and subsequently transmitting the software as a computer data signal over a communication network including the Internet and intranets.

It is understood that the apparatus and method described herein may be included in a semiconductor intellectual property core, such as a microprocessor core (e.g., embodied in HDL) and transformed to hardware in the production of integrated circuits. Additionally, the apparatus and methods described herein may be embodied as a combination of hardware and software. Thus, the present invention should not be limited by any of the above-described exemplary embodiments, but should be defined only in accordance with the following claims and their equivalents.

The invention claimed is:

1. A radio system for relaying packetized radio signals, the radio system comprising:
    at least one transmit path adapted to forward a packetized payload signal as a transmit signal, the at least one transmit path comprising a coupler for extracting a coupled transmit signal out of the transmit signal,
    a single synchronization unit for extracting a temporal order of the packetized payload signal and providing a clocking signal from the packetized payload signal,
    a base band calibration signal generator adapted to insert a continuous base band calibration signal into the packetized payload signal, the base band calibration signal being synchronized to the clocking signal, so that the continuous base band signal is synchronized to the packetized payload signal
    a digital predistortion unit adapted to apply a digital predistortion to the packetized payload signal for linearising a transfer characteristic of the radio system,
    a calibration unit adapted to apply phase and amplitude changes to the at least one transmit path,
    a feedback path commonly used by the digital predistortion unit and the calibration unit for feeding back a feedback signal, wherein at least one of the phase and amplitude changes and the digital predistortion is adapted using the said feedback signal
    a calibration signal modulator for transforming the base band calibration signal into a calibration signal for calibrating the feedback path, wherein the digital predistortion unit updates the digital predistortion in response to the feedback signal,
    wherein the calibration signal is forwarded as the feedback signal, wherein the calibration signal comprises a signal change portion pertaining to the calibration of the phase and amplitude changes, wherein the signal change portion is provided in at least one of a frequency outside of a frequency band used in connection with the digital predistortion or in the form of a narrow band signal of vanishing value.

2. The radio system according to claim 1, wherein at least one of the phase and amplitude changes and the digital predistortions is adaptable using correlations of at least two of the packetized payload signal, the base band calibration signal and the feedback signal.

3. The radio system according to claim 1, wherein the base band calibration signal is concurrently used by the calibration unit and the digital predistortion unit.

4. The radio system according to claim 1, further comprising a calibration update module for updating the phase and amplitude changes.

5. The radio system according to claim 1, further comprising a digital predistortion update module for updating the digital predistortion.

6. The radio system according to claim 1, further comprising a feedback signal demodulator for receiving the feedback signal.

7. The radio system according to claim 1, wherein the at least one transmit path is terminated by an antenna element.

8. The radio system according to claim 1, wherein the at least one transmit path further comprises a digital to analogue converter.

9. The radio system according to claim 8, wherein the digital to analogue converter comprises a sigma delta digital to analogue converter.

10. The radio system according to claim 1, wherein the at least one transmit path further comprises an amplifier for amplifying the transmit signal.

11. The radio system according to claim 1, wherein the at least one transmit path further comprises a filter filtering the transmit signal.

12. The radio system according to claim 11, wherein the filter comprises a duplex filter.

13. The radio system according to claim 1, further comprising a combiner for combining the coupled transmit signals and the calibration signal as the feedback signal into the feedback path.

14. The radio system according to claim 1, further comprising a suppressor for selectively suppressing at least an individual one of the coupled transmit signal.

15. The radio system according to claim 14, wherein the supressor comprises at least one of: an RF switch and a variable attenuator.

16. The radio system according to claim 15, wherein at least one of the following elements is implemented on a chip: the calibration unit, the predistortion unit, the calibration update module, the digital predistortion update module, the base band calibration signal generator, the digital to analogue converter, the calibration signal modulator, the synchronization module and the feedback signal demodulator.

17. The radio system according to claim 16 wherein the chip comprises a digital signal processor (DSP).

18. A method for relaying packetized radio signals, the method comprising:
    providing a packetized payload signal,
    extracting a temporal order of the packetized signal and providing a clocking signal
    generating a continuous base band calibration signal adapted to be inserted into the packetized payload signal, wherein the continuous base band calibration signal is in synchronization with said clocking signal,
    applying a digital predistortion to the packetized payload signal,
    applying phase and amplitude changes to at least one transmit path,
    forwarding the packetized payload signal as a transmit signal along at least one transmit path,
    feeding back a feedback signal, wherein the calibration signal is forwarded as the feedback signal,
    updating the digital predistortion in response to the feedback signal, and
    updating the phase and amplitude changes in response to the feedback signal
    modulating the base band calibration signal to yield a calibration signal and feeding back the calibration signal as the feedback signal,
    wherein the calibration signal comprises a signal change portion pertaining to the calibration of the phase and amplitude changes, wherein the signal change portion is provided in at least one of a frequency outside of a frequency band used in connection with the digital predistortion or in the form of a narrow band signal of vanishing value.

19. The method according to claim 18, wherein at least one of the updating of the digital predistortions and the updating the phase and amplitude changes comprises using correlation methods.

20. The method according to claim 18, wherein the forwarding of the packetized payload signal as a transmit signal along the at least one transmit path further comprises:
    digital to analogue converting the transmit signal,
    amplifying the transmit signal,
    filtering the transmit signal,
    extracting a coupled transmit signal from the at least one transmit path.

21. The method according to claim 18 further comprising:
    feeding back a combination of the coupled transmit signals and the calibration signal as the feedback signal.

22. The method according to claim 18, wherein the feeding back of the feedback signal into the feedback path comprises:
    receiving the feedback signal at a feedback signal demodulator,
    generating a base band feedback signal responsive to the receiving.

23. The method according to claim 18, wherein the updating of the digital predistortion comprises:
    comparing the payload signal and the base band feedback signal,
    extracting differences between the payload signal and the base band feedback signal,
    checking if the differences are below a threshold, and
    updating the digital predistortion responsive to the checking.

24. The method according to claim 18, wherein the updating of the phase and amplitude changes comprises:
    correlating the payload and the base band feedback signal,
    extracting transmit deviations,
    checking whether the transmit deviations are above a threshold, and
    updating the phase and amplitude changes responsive to the checking.

25. Computer program product embodied on a non-transitory computer-readable medium and the non-transitory computer-readable medium comprising executable instructions for the manufacture of the radio system according to claim 1.

26. Computer program product embodied on a non-transitory computer-readable medium and the non-transitory computer-readable medium comprising executable instructions for the execution of the method for relaying radio signals according to claim 18.

* * * * *